US012494421B2

(12) United States Patent
Kwon et al.

(10) Patent No.: US 12,494,421 B2
(45) Date of Patent: Dec. 9, 2025

(54) SEMICONDUCTOR PACKAGE INCLUDING REDISTRIBUTION STRUCTURE, AND METHOD OF MANUFACTURING THE SAME

(71) Applicant: NEPES CO., LTD.

(72) Inventors: Yong Tae Kwon, Eumseong (KR); Hyo Young Kim, Eumseong (KR); Eun Yeong Son, Eumseong (KR); Seung Ho Lee, Eumseong (KR); Kyeung Hwan Kim, Eumseong (KR); Jong Hyun Park, Eumseong (KR)

(73) Assignee: NEPES CO., LTD., Eumseong-gun (KR)

( * ) Notice: Subject to any disclaimer, the term of this patent is extended or adjusted under 35 U.S.C. 154(b) by 541 days.

(21) Appl. No.: 17/938,672

(22) Filed: Oct. 6, 2022

(65) Prior Publication Data

US 2023/0128862 A1   Apr. 27, 2023

(30) Foreign Application Priority Data

Oct. 7, 2021  (KR) ................. 10-2021-0133458
Nov. 8, 2021  (KR) ................. 10-2021-0152440
(Continued)

(51) Int. Cl.
*H01L 21/48* (2006.01)
*H01L 23/00* (2006.01)
(Continued)

(52) U.S. Cl.
CPC .... *H01L 23/49838* (2013.01); *H01L 21/4857* (2013.01); *H01L 21/486* (2013.01); (Continued)

(58) Field of Classification Search
CPC ........... H01L 23/49838; H01L 21/4857; H01L 23/3128
See application file for complete search history.

(56) References Cited

U.S. PATENT DOCUMENTS

2011/0274853 A1   11/2011   Park et al.
2014/0327137 A1*  11/2014   Hayashi ............... H01L 23/373
                                                257/737
(Continued)

FOREIGN PATENT DOCUMENTS

KR  10-2011-0122642 A   11/2011
KR  10-2019-0003403 A    1/2019
(Continued)

OTHER PUBLICATIONS

TW OA issued on Jun. 19, 2023.

*Primary Examiner* — Thao P Le
(74) *Attorney, Agent, or Firm* — Harvest IP LAW, LLP

(57) ABSTRACT

Provided is a semiconductor package including a redistribution structure including at least one redistribution insulating layer and at least one redistribution pattern, at least one semiconductor chip located on the redistribution structure, and a molding layer located on the redistribution structure and covering the at least one semiconductor chip. The redistribution pattern includes a redistribution via passing through the redistribution insulating layer and extending in a first direction perpendicular to a top surface of the redistribution structure, and a redistribution line extending in a second direction parallel to the top surface of the redistribution structure. Inner side walls of the redistribution via have a certain inclination, and a difference between a thickness of a central portion of the redistribution line and a thickness of an edge of the redistribution line ranges from 1% to 10% of the thickness of the central portion of the redistribution line.

9 Claims, 25 Drawing Sheets

(30) Foreign Application Priority Data

Nov. 17, 2021 (KR) .................. 10-2021-0158720
Dec. 29, 2021 (KR) .................. 10-2021-0191863
Feb. 3, 2022 (KR) .................. 10-2022-0014391

(51) Int. Cl.
*H01L 23/31* (2006.01)
*H01L 23/498* (2006.01)
*H10B 80/00* (2023.01)

(52) U.S. Cl.
CPC .... *H01L 23/3128* (2013.01); *H01L 23/49816* (2013.01); *H01L 23/49822* (2013.01); *H01L 23/49833* (2013.01); *H01L 23/49866* (2013.01); *H01L 24/08* (2013.01); *H10B 80/00* (2023.02); *H01L 2224/08235* (2013.01); *H01L 2924/1431* (2013.01); *H01L 2924/1432* (2013.01); *H01L 2924/1436* (2013.01); *H01L 2924/1511* (2013.01); *H01L 2924/15184* (2013.01); *H01L 2924/15311* (2013.01)

(56) References Cited

U.S. PATENT DOCUMENTS

| | | |
|---|---|---|
| 2019/0006283 A1 | 1/2019 | Wang et al. |
| 2019/0103353 A1 | 4/2019 | Liu et al. |
| 2020/0043840 A1* | 2/2020 | Kim .................. H01L 21/4857 |
| 2021/0118788 A1 | 4/2021 | Lee et al. |
| 2023/0420352 A1* | 12/2023 | Ko .................. H01L 24/19 |
| 2024/0136272 A1* | 4/2024 | Lee .................. H01L 21/486 |
| 2025/0046769 A1* | 2/2025 | Choi .................. H01L 24/20 |
| 2025/0140727 A1* | 5/2025 | Shin .................. H01L 23/3128 |

FOREIGN PATENT DOCUMENTS

| | | |
|---|---|---|
| KR | 10-2019-0038357 A | 4/2019 |
| KR | 10-2021-0046429 A | 4/2021 |
| TW | 202025313 A | 7/2020 |
| TW | 202109782 A | 3/2021 |
| TW | 202133351 A | 9/2021 |

* cited by examiner

SEMICONDUCTOR PACKAGE INCLUDING REDISTRIBUTION STRUCTURE, AND METHOD OF MANUFACTURING THE SAME

CROSS-REFERENCE TO RELATED APPLICATIONS

This application is based on and claims priority under 35 U.S.C. § 119 to Korean Patent Application Nos. 10-2021-0133458, 10-2021-0152440, 10-2021-0158720, 10-2021-0191863, and 10-2022-0014391, respectively filed on Oct. 7, 2021, Nov. 8, 2021, Nov. 17, 2021, Dec. 29, 2021, and Feb. 3, 2022, in the Korean Intellectual Property Office, the disclosures of which are incorporated by reference herein in their entirety.

BACKGROUND

1. Field

The disclosure relates to a semiconductor package and a method of manufacturing the same. More particularly, the disclosure relates to a semiconductor package including a redistribution structure, and a method of manufacturing the semiconductor package.

2. Description of the Related Art

With the development of electronic technology, electronic devices have become gradually smaller and multifunctional and have larger capacity. Accordingly, a semiconductor package including a redistribution structure has been developed for a highly integrated semiconductor chip with an increased number of connection terminals for data input/output (I/O).

SUMMARY

Provided is a semiconductor package including a redistribution structure in which functional characteristics may be improved and a manufacturing process may be simplified.

Provided is a method of manufacturing a semiconductor package in which functional characteristics may be improved and a manufacturing process may be simplified.

Additional aspects will be set forth in part in the description which follows and, in part, will be apparent from the description, or may be learned by practice of the presented embodiments.

According to an aspect of the disclosure, a semiconductor package includes a first redistribution structure including at least one first redistribution insulating layer including a photo-imageable dielectric (PID) material, and at least one first redistribution pattern including a first redistribution via and a first redistribution line, and at least one semiconductor chip located on the first redistribution structure, wherein the first redistribution via includes a first via layer located over a via hole passing through the first redistribution insulating layer in a vertical direction and having a first thickness, a second via layer located on an inner side wall of the via hole and having a second thickness, and a third via layer located under the via hole and having a third thickness, wherein the second via layer has a certain inclination angle with respect to a horizontal direction, wherein the first thickness and the second thickness are substantially same, and the third thickness is about 0.25 times to about 0.75 times the first thickness.

The first redistribution via may have one shape selected from among a polygonal shape, a circular shape, an elliptical shape, a polygonal shape with round corners, and a polygonal shape with protruding corners, in a plane perpendicular to the vertical direction.

The angle of the second via layer with respect to the horizontal direction may range from 30° to 80°.

A top surface and a bottom surface of the first redistribution pattern may extend in the horizontal direction, and a side surface of the first redistribution pattern may extend in the vertical direction.

The semiconductor package may further include a molding layer located on the first redistribution structure, and covering at least a part of the semiconductor chip, wherein a horizontal width of the first redistribution structure is greater than a horizontal width of the semiconductor chip.

The semiconductor package may further include a connection structure located on the first redistribution structure to be spaced apart from the semiconductor chip, and a second redistribution structure located on the semiconductor chip.

The connection structure may include one of a through-mold via (TMV), a conductive solder, a conductive pillar, and a conductive bump.

The semiconductor chip may include a plurality of semiconductor chips that are spaced apart from each other, and some of the plurality of semiconductor chips may be memory chips and rest of the plurality of semiconductor chips may be logic chips.

According to another aspect of the disclosure, a method of manufacturing a semiconductor package includes providing a semiconductor chip on a carrier substrate, forming a redistribution insulating layer including a photo-imageable dielectric (PID) material on the semiconductor chip, forming a via hole passing through the redistribution insulating layer, forming, on the redistribution insulating layer, a photoresist pattern having a tapered shape whose horizontal width decreases from a top surface to a bottom surface, forming a redistribution pattern on the redistribution insulating layer and the via hole by using the photoresist pattern, and removing the photoresist pattern by using a lift-off method, wherein the via hole is formed at a certain inclination angle.

The forming of the redistribution pattern may include performing any one selected from among sputtering, electron-beam evaporation, and electroless plating.

The forming of the redistribution pattern may include alternately performing sputtering and deposition.

A ratio between a horizontal width of the top surface of the photoresist pattern and a horizontal width of the bottom surface of the photoresist pattern may range from 1:0.9 to 1:0.3.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION

Figure 1:
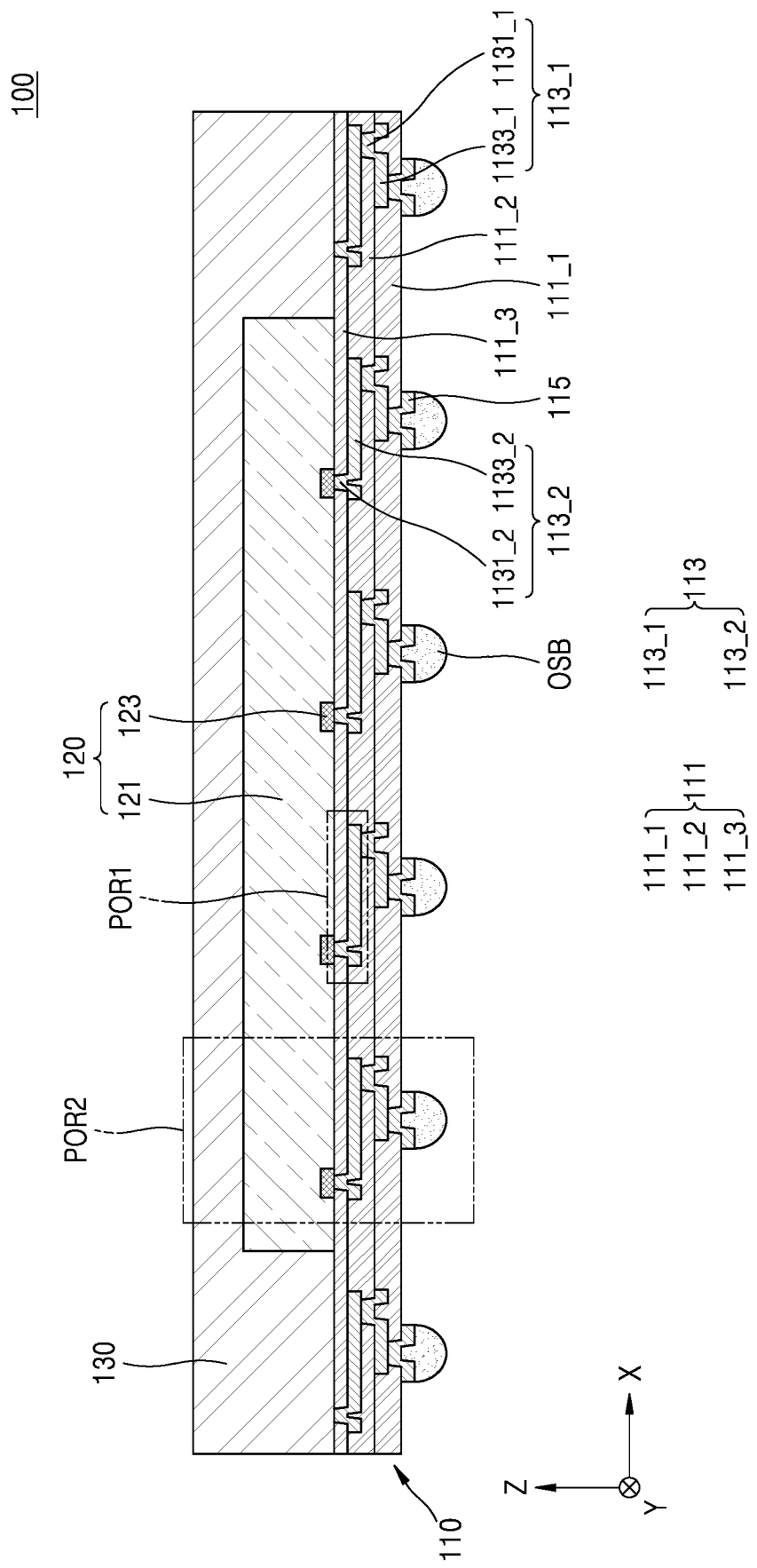
FIG. 1 is a cross-sectional view illustrating a semiconductor package, according to embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, preferred embodiments of the present disclosure will be described in detail with reference to the accompanying drawings. The disclosure may, however, be embodied in many different forms and should not be construed as being limited to the embodiments set forth herein. These embodiments are provided so that this disclosure will be thorough and complete, and will fully convey the concept of the disclosure to one of ordinary skill in the art. Like reference numerals denote like elements throughout. Furthermore, various elements and regions in the drawings are schematically illustrated. Accordingly, the inventive concept is not limited by a relative size or interval illustrated in the drawings.

It will be understood that although the terms "first," "second," etc. may be used herein to describe various components, these components should not be limited by these terms. The above terms are used only to distinguish one component from another. For example, a first element may be named a second element and conversely a second element may be named a first element without departing from the scope of the inventive concept.

The terms used in the present application are merely used to describe specific embodiments, and are not intended to limit the inventive concept. The singular forms "a," "an," and "the" are intended to include the plural forms as well, unless the context clearly indicates otherwise. Further, as used in this application, the terms "include," "have" and their conjugates may be construed to denote a certain feature, number, step, operation, constituent element, component, or a combination thereof, but may not be construed to exclude the existence or addition of one or more other features, numbers, steps, operations, constituent elements, components, or combinations thereof.

All terms including technical and scientific terms used herein have meanings which may be generally understood by one of ordinary skill in the art, if the terms are not particularly defined. Also, general terms defined by dictionaries should be understood to have meanings which may be contextually understood in the art and should not have ideally or excessively formal meanings, if the terms are not defined particularly herein by the disclosure.

Figure 2A:
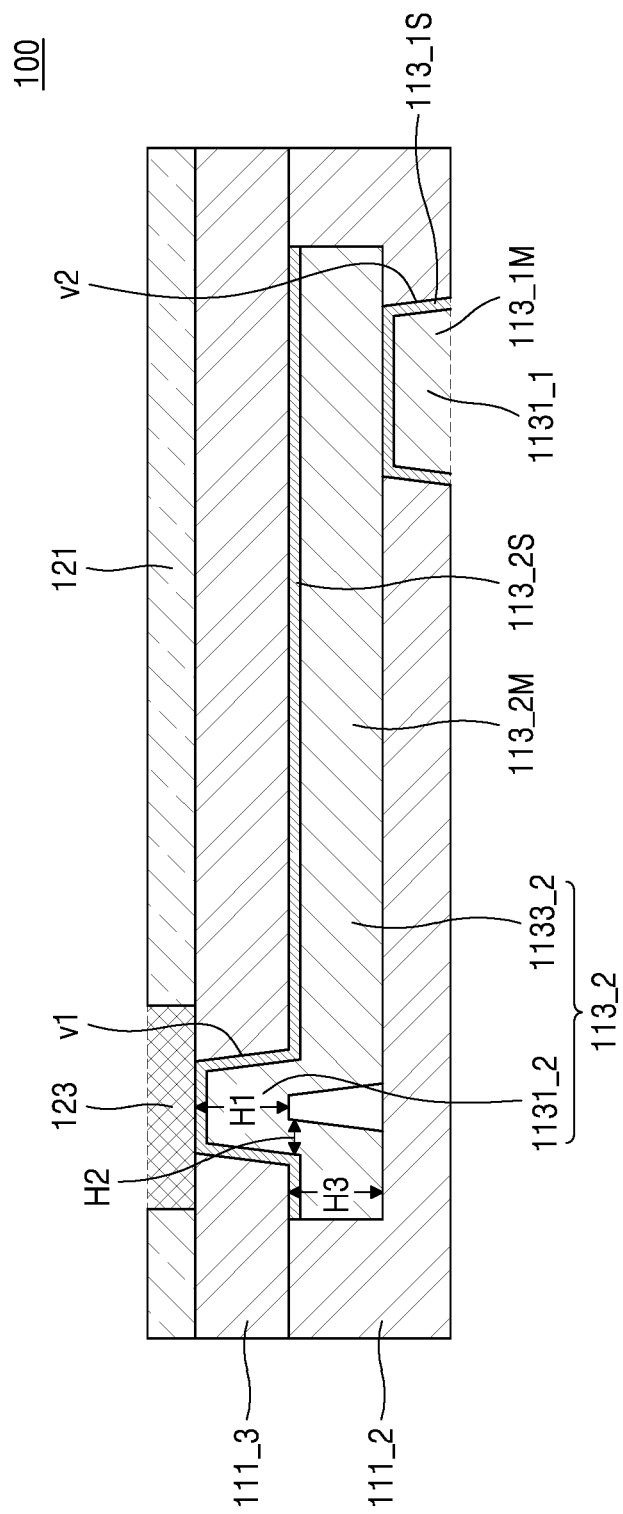
FIGS. 2A and 2B are enlarged cross-sectional views illustrating a portion POR1 of FIG. 1.
Figure 2B:
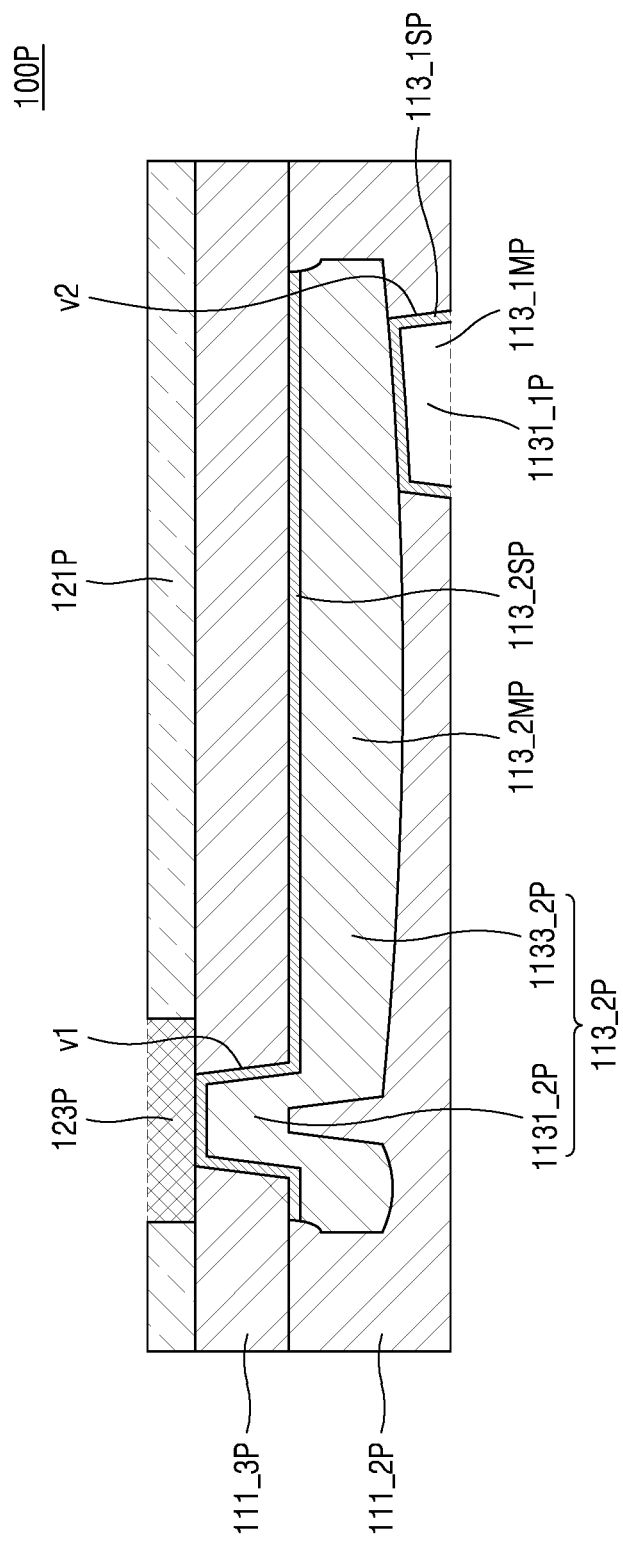

FIG. 1 is a cross-sectional view illustrating a semiconductor package 100, according to embodiments. FIGS. 2A and 2B are enlarged cross-sectional views illustrating a portion POR1 of FIG. 1. In detail, FIG. 2A is an enlarged cross-sectional view illustrating the semiconductor package 100, according to an embodiment. FIG. 2B is an enlarged cross-sectional view illustrating a conventional semiconductor package 100P.

Referring to FIG. 1, the semiconductor package 100 may include a redistribution structure 110, a semiconductor chip 120, and a molding layer 130.

The redistribution structure 110 may be a substrate on which the semiconductor chip 120 is mounted. Unless otherwise defined, a direction parallel to a top surface of the redistribution structure 110 (i.e., a top surface of a third redistribution insulating layer 111_3) is defined as a horizontal direction (e.g., an X direction and/or a Y direction), and a direction perpendicular to the top surface of the redistribution structure 110 is defined as a vertical direction (e.g., a Z direction).

The redistribution structure 110 may include a redistribution insulating layer 1101, a redistribution pattern 113, and a UBM layer 115.

The redistribution insulating layer 111 may include a first redistribution insulating layer 111_1, a second redistribution insulating layer 111_2, and a third redistribution insulating layer 111_3. In an embodiment, each of the first redistribution insulating layer 111_1, the second redistribution insulating layer 111_2, and the third redistribution insulating layer 111_3 may include a photo-imageable dielectric (PID) material. For example, each of the first redistribution insulating layer 111_1, the second redistribution insulating layer 111_2, and the third redistribution insulating layer 111_3 may include photosensitive polyimide (PSPI). Although the redistribution insulating layer 111 includes three redistribution insulating layers in FIG. 1, the disclosure is not limited thereto. For example, the redistribution insulating layer 111 may include a single redistribution insulating layer, or may include four or more redistribution insulating layers.

The redistribution pattern 113 may include a first redistribution pattern 113_1 and a second redistribution pattern 113_2. The redistribution pattern 113_1 may include a first redistribution via 1131_1 and a first redistribution line 1133_1. The first redistribution via 1131_1 may be located on a top surface of the first redistribution insulating layer 111_1, and may extend in the vertical direction while passing through at least a part of the second redistribution insulating layer 111_2. The first redistribution line 1133_1 may be connected to the first redistribution via 1131_1, and may be located on a bottom surface of the second redistribution insulating layer 111_2. At least a part of the first redistribution line 1133_1 may be covered by the first redistribution insulating layer 111_1. For example, a bottom surface and both side surfaces of the first redistribution line 1133_1 may be covered by the first redistribution insulating layer 111_1. The first redistribution via 1131_1 and the first redistribution line 1133_1 may be integrally formed with each other, as described below with reference to FIG. 9F. Accordingly, the first redistribution via 1131_1 and the first redistribution line 1133_1 may be integrally formed with each other.

The second redistribution pattern 113_2 may include a second redistribution via 1131_2 and a second redistribution line 1133_2. The second redistribution via 1131_2 may be located on a top surface of a third redistribution insulating layer 113_3, and may extend in the vertical direction while passing through the third redistribution insulating layer 113_3. The second redistribution line 1133_2 may be connected to the second redistribution via 1131_2 and the first redistribution via 1131_1, and may be located on a bottom surface of the third redistribution insulating layer 111_3. At least a part of the second redistribution line 1133_2 may be covered by the second redistribution insulating layer 111_2. For example, a bottom surface and both side surfaces of the second redistribution line 1133_2 may be covered by the second redistribution insulating layer 111_2. The second redistribution via 1131_2 and the second redistribution line 1133_2 will be integrally formed with each other, as described below with reference to FIG. 9C. Accordingly, the second redistribution via 1131_2 and the second redistribution line 1133_2 may be integrally formed with each other.

In embodiments, each of the first redistribution via 1131_1 and the second redistribution via 1131_2 may have a tapered shape whose horizontal width increases from the top surface to a bottom surface of the redistribution structure 110.

The reason why each of the first redistribution via 1131_1 and the second redistribution via 1131_2 has a tapered shape whose horizontal width increases from the top surface to the bottom surface of the redistribution structure 110 is that the redistribution structure 110 is formed by using a chip-first method, as described below with reference to FIGS. 9A through 9K. However, the disclosure is not limited thereto, and when the redistribution structure 110 is formed by using a chip-last method, each of the first redistribution via 1131_1 and the second redistribution via 1131_2 may have a tapered shape whose horizontal width decreases from the top surface to the bottom surface of the redistribution structure 110.

The redistribution pattern 113 may include a metal such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), or ruthenium (Ru), or an alloy thereof.

In an embodiment, the first redistribution pattern 113_1 may include a first seed layer 113_1S covering an inner wall of a second via hole V2 (see FIG. 2A) formed in the second redistribution insulating layer 111_2 and a bottom surface of the second redistribution insulating layer 111_2, and a first metal layer 113_1M located on a bottom surface of the first seed layer 113_1S, and the second redistribution pattern 113_2 may include a second seed layer 113_2S covering an inner wall of a first via hole V1 (see FIG. 2A) formed in the third redistribution insulating layer 111_3 and a bottom surface of the third redistribution insulating layer 111_3, and a second metal layer 113_2M located on a bottom surface of the second seed layer 113_2S. In an embodiment, a thickness of each of the first seed layer 113_1S and the second seed layer 113_2S may range from about 0.01 μm to about 3 μm, and a thickness of each of the first metal layer 113_1M and the second metal layer 113_2M may range from about 1 μm to about 20 μm.

In an embodiment, each of the first metal layer 113_1M and the second metal layer 113_2M may include a plurality of layers (not shown). For example, the first metal layer 113_1M may include three layers. In this case, each of the plurality of layers (not shown) may include a metal such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), ruthenium (Ru), or gold (Au), or an alloy thereof. For example, the first metal layer 113_1M may include three layers sequentially formed on the first seed layer 113_1S, and the three layers may respectively include copper, nickel, and tin. The redistribution pattern 113 will now be described in more detail with reference to FIGS. 2A and 2B.

Referring to FIG. 2A, the second redistribution via 1131_2 of the second redistribution pattern 113 may include a first via layer over the first via hole V1, a second via layer on an inner side wall of the first via hole V1, and a third via layer on a top surface of the second insulating layer 111_2. In an embodiment, a thickness H1 of the first via layer and a thickness H3 of the third via layer may be substantially the same, and a ratio between the thickness H1 of the first via layer and the thickness H2 of the second via layer may range from about 1:0.25 to about 1:0.75. For example, when the thickness H1 of the first via layer is about 10 μm, a thickness H2 of the second via layer may be about 4 μm, and the thickness H3 of the third via layer may be about 9.9 μm. In an embodiment, the second via layer may extend along the inner side wall of the first via hole V1 while maintaining a certain inclination. For example, the second via layer may extend downward while having an angle of 60° with respect to the horizontal direction. In an embodiment, the second redistribution line 1133_2 of the second redistribution pattern 113 may extend on the top surface of the second insulating layer 111_2 in the horizontal direction. In this case, a thickness of a central portion of the second redistribution line 1133_2 may be substantially the same as or similar to a thickness of an edge of the second redistribution line 1133_2. Accordingly, a bottom surface of the second redistribution line 1133_2 may be a flat surface substantially parallel to the horizontal direction. In an embodiment, a side surface of the second redistribution line 1133_2 may extend through the second insulating layer 111_2 in the vertical direction. Accordingly, the side surface of the second redistribution line 1133_2 may be substantially perpendicular to the top surface of the second insulating layer 111_2. The reason why the above feature is provided is that, as described below with reference to FIGS. 9A through 9K, a first photoresist pattern PR1 (see FIG. 9C) used to form the second redistribution pattern 113_2 has a tapered shape whose horizontal width varies from a top surface to a bottom surface, the second redistribution pattern 113_2 is formed by using sputtering or electron-beam evaporation, and the first photoresist pattern PR1 is removed by using a lift-off method. Although only the second redistribution via 1131_2 and the second redistribution line 1133_2 are illustrated in FIG. 2A, the first redistribution via 1131_1 and the first redistribution line 1133_2 may also be substantially the same as or similar to the second redistribution via 1131_2 and the second redistribution line 1133_2.

Referring to FIG. 2B, in a second vertical redistribution via 1131_2P and a second redistribution line 1133_2P of the conventional semiconductor package 100P, a part of a side surface of the second redistribution line 1133_2P adjacent to a top surface of a second redistribution insulating layer 111_2P may not be perpendicular to a top surface of a second redistribution insulating layer 113_2P. That is, an under-cut may occur in a part of the side surface of the second redistribution line 1133_2P adjacent to the top surface of the second redistribution insulating layer 111_2P. Also, a thickness of a central portion of the second redistribution line 1133_2P may be different from a thickness of an edge of the second redistribution line 1133_2P. Accordingly, a bottom surface of the second redistribution line 1133_2P may have an arc shape. The reason why the above feature is provided is that a conventional distribution structure is manufactured by forming a seed layer, forming a photoresist pattern on the seed layer, forming a redistribution pattern by performing electroplating by using the seed layer and the photoresist pattern, removing the photoresist pattern, and etching the seed layer exposed by the redistribution pattern. Because the above feature of the conventional redistribution structure degrades electrical characteristics of the redistribution pattern included in the conventional redistribution structure, functional characteristics of the conventional semiconductor package may be degraded.

Referring back to FIG. 1, the UBM layer 115 may be located on a bottom surface of the first redistribution pattern 113_1. In detail, the UBM layer 115 may be located on a bottom surface of the first redistribution line 1133_1 of the first redistribution pattern 113-1, and may pass through at least a part of the first redistribution insulating layer 111_1. The UBM layer 115 may electrically connect the first redistribution pattern 113_1 and the second redistribution pattern 113_2 to an external connection terminal OSB. The UBM layer 115 may include a metal such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), or ruthenium (Ru), or an alloy thereof. The UBM layer 115 may further include a UBM seed layer (not shown). In this case, the UBM seed layer may be formed by performing, for example, physical vapor deposition, and the UBM layer 115 may be formed through electroplating using the UBM seed layer.

The external connection terminal OSB may be located on a bottom surface of the redistribution structure 110. The external connection terminal OSB may include, for example, a solder. Some of the external connection terminals OSB may overlap the semiconductor chip 120 in the vertical direction, and others of the external connection terminals OSB may not overlap the semiconductor chip 120 in the vertical direction. The external connection terminal OSB may physically and electrically connect an external device to the semiconductor package 100.

The semiconductor chip 120 may be mounted on the redistribution structure 110. In an embodiment, the semiconductor chip 120 may be a memory chip or a logic chip. The memory chip may be a volatile memory chip such as a dynamic random-access memory (DRAM) or a static random-access memory (SRAM), or a non-volatile memory chip such as a phase-change random-access memory (PRAM), a magnetoresistive random-access memory (MRAM), a ferroelectric random-access memory (FeRAM), or a resistive random-access memory (RRAM). Also, the logic chip may be, for example, a microprocessor, an analog device, or a digital signal processor. The semiconductor chip 120 may include a semiconductor substrate 121 and a chip pad 123.

The semiconductor substrate 121 may include a group IV semiconductor such as silicon (Si) or germanium (Ge), a group IV-IV compound semiconductor such as silicon-germanium (SiGe) or silicon carbide (SiC), or a group III-V compound semiconductor such as gallium arsenide (GaAs), indium arsenide (InAs), or indium phosphide (InP). The semiconductor substrate 121 may include a conductive region, for example, a well doped with impurities. The semiconductor substrate 121 may have any of various device isolation structures such as a shallow trench isolation (STI) structure.

The semiconductor substrate 121 may have an active surface (not shown) and an inactive surface (not shown) opposite to the active surface. The active surface of the semiconductor substrate 121 may correspond to a bottom surface of the semiconductor substrate 121, and the inactive surface of the semiconductor substrate may correspond to a top surface of the semiconductor substrate 121. Various types of individual devices may be provided on the active surface. The plurality of individual devices may include various microelectronic devices, for example, a metal-oxide-semiconductor field-effect transistor (MOSFET) such as a complementary metal-oxide semiconductor (CMOS) transistor, an image sensor such as a system large scale integration (LSI) or a CMOS imaging sensor (CIS), a micro-electro-mechanical system (MEMS), an active device, and a passive device. The plurality of individual devices may be electrically connected to the conductive region of the semiconductor substrate 121. Each of the plurality of individual devices may be electrically isolated from other neighboring individual devices by an insulating layer (not shown).

The chip pad 123 may be located on the bottom surface of the semiconductor substrate 121. The semiconductor chip 120 and the redistribution structure 110 may be physically and electrically connected to each other by the chip pad 123.

The molding layer 130 may be located on the redistribution structure 110. The molding layer 130 may cover at least a part of the semiconductor chip 120. For example, the molding layer 130 may cover at least a part of a bottom surface, a top surface, and both side surfaces of the semiconductor chip 120. Although a top surface of the molding layer 130 is located at a vertical level higher than the top surface of the semiconductor chip 120 in FIG. 1, the disclosure is not limited thereto. For example, the top surface of the molding layer 130 and the top surface of the semiconductor chip 120 may be coplanar. In an embodiment, the molding layer 130 may include an epoxy molding compound (EMC).

A conventional package includes a redistribution structure manufactured by forming a seed layer, forming a photoresist pattern on the seed layer, forming a redistribution pattern by performing electroplating by using the seed layer and the photoresist pattern, removing the photoresist pattern, and etching the seed layer exposed by the redistribution pattern. In the redistribution structure according to the conventional manufacturing method, because the redistribution pattern is formed by using electroplating, an under-cut may occur in the redistribution pattern as described with reference to FIG. 2B. Also, as described with reference to FIG. 2B, because a thickness of an edge of the redistribution pattern and a thickness of a central portion of the redistribution pattern are different from each other, a top surface or a bottom surface of the redistribution pattern may have an arc shape. Accordingly, electrical characteristics of the redistribution pattern may be degraded, and thus, functional characteristics of the semiconductor package including the redistribution pattern may be degraded.

In contrast, in the semiconductor package 100 according to an embodiment, because a redistribution pattern is formed by using sputtering or electron-beam evaporation, an under-cut may not occur at an edge of the redistribution pattern, and a thickness of an edge of the redistribution pattern and a thickness of a central portion of the redistribution pattern are substantially the same or similar. Accordingly, electrical characteristics of the redistribution pattern may be improved, and functional characteristics of the semiconductor package 100 including the redistribution pattern may be improved. Also, because a manufacturing method is simpler than the conventional method of manufacturing the redistribution structure, the productivity of a process of manufacturing the semiconductor package 100 may also be improved.

FIGS. 3A through 3F are plan views illustrating redistribution structures 110, 110_1, 110_2, 110_3, 110_4, and 110_5, according to an embodiment.

Figure 3A:
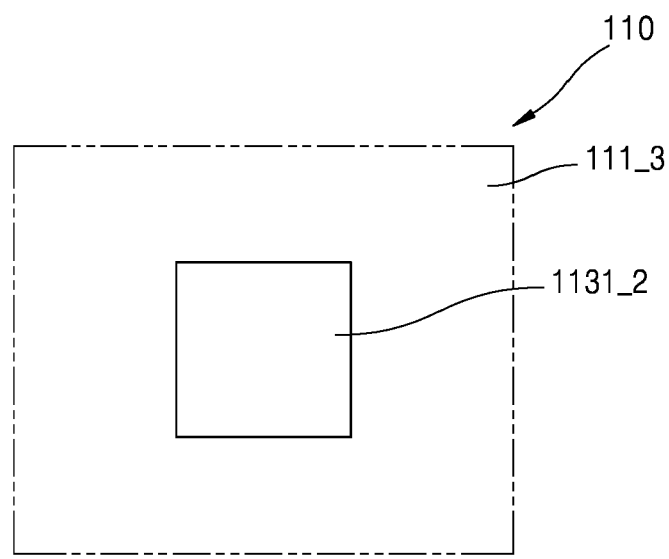
FIGS. 3A through 3F are plan views illustrating redistribution structures, according to an embodiment.
Figure 3A:
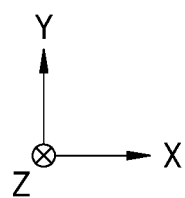

Referring to FIG. 3A, the redistribution structure 110 may include the second redistribution via 1131_2 having a quadrangular shape and extending through the third redistribution insulating layer 111_3 in the vertical direction. That is, in a process of forming the first via hole V1 (see FIG. 9B) described below with reference to FIG. 9B, the first via hole V1 may be formed in a quadrangular shape in an X-Y plane, and the second redistribution via 1131_2 filling the first via hole V1 may also have a quadrangular shape in the X-Y plane.

Figure 3B:
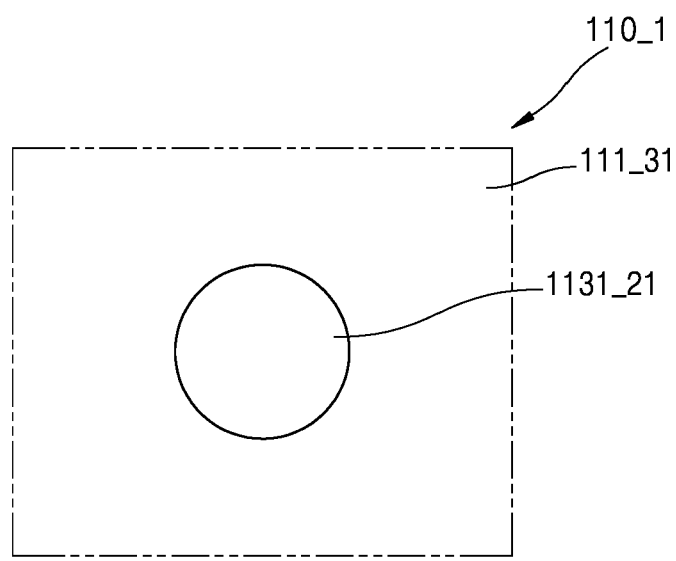

Referring to FIG. 3B, the redistribution structure 110_1 may include a second redistribution via 1131_21 having a circular shape and extending through a third redistribution insulating layer 111_31 in the vertical direction. That is, in a process of forming the first via hole V1 (see FIG. 9B) described below with reference to FIG. 9B, the first via hole V1 may be formed in a circular shape in the X-Y plane, and the second redistribution via 1131_21 filling the first via hole V1 may also have a circular shape in the X-Y plane. In this case, the circular shape may include a circular shape or an elliptical shape.

Figure 3C:
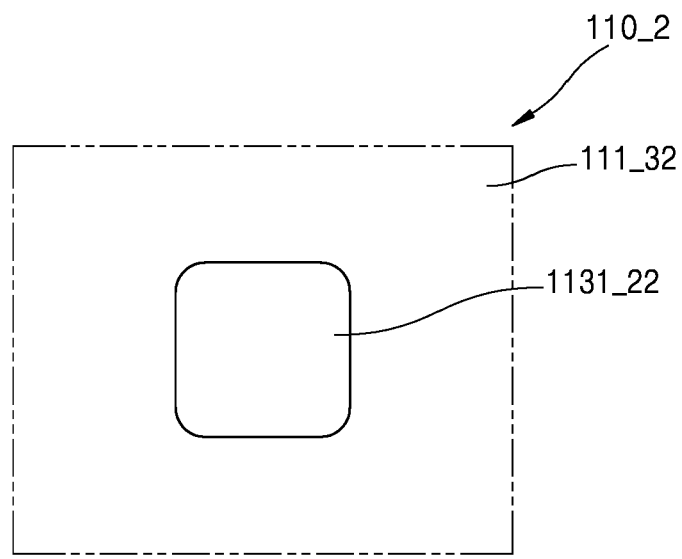
Figure 3C:
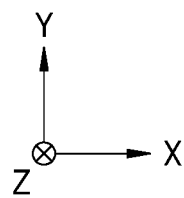

Referring to FIG. 3C, the redistribution structure 110_2 may include a second redistribution via 1131_22 having a quadrangular shape with round corners and extending through a third redistribution insulating layer 111_32 in the vertical direction. That is, in a process of forming the first via hole V1 (see FIG. 9B) described below with reference to FIG. 9B, the first via hole V1 may be formed in a quadrangular shape with round corners in the X-Y plane, and the second redistribution via 1131_22 filling the first via hole V1 may also have a quadrangular shape with round corners in the X-Y plane.

Figure 3D:
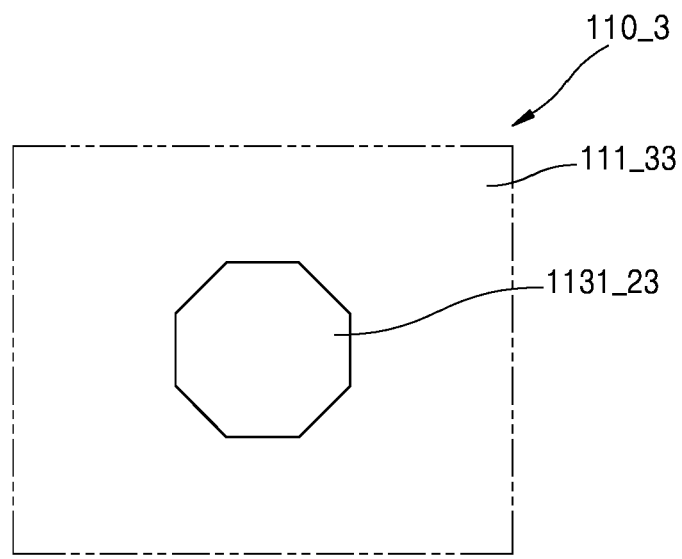

Referring to FIG. 3D, a redistribution structure 110_3 may include a second redistribution via 1131_23 having a polygonal shape and extending through a third redistribution insulating layer 111_33 in the vertical direction. That is, in a process of forming the first via hole V1 (see FIG. 9B) described below with reference to FIG. 9B, the first via hole V1 may be formed in a polygonal shape in the X-Y plane, and the second redistribution via 1131_23 filling the first via hole V1 may also have a polygonal shape in the X-Y plane. Although the polygonal shape is an octagonal shape in FIG. 3D, the disclosure is not limited thereto. Also, the polygonal shape may have round corners like in FIG. 3C.

Figure 3E:
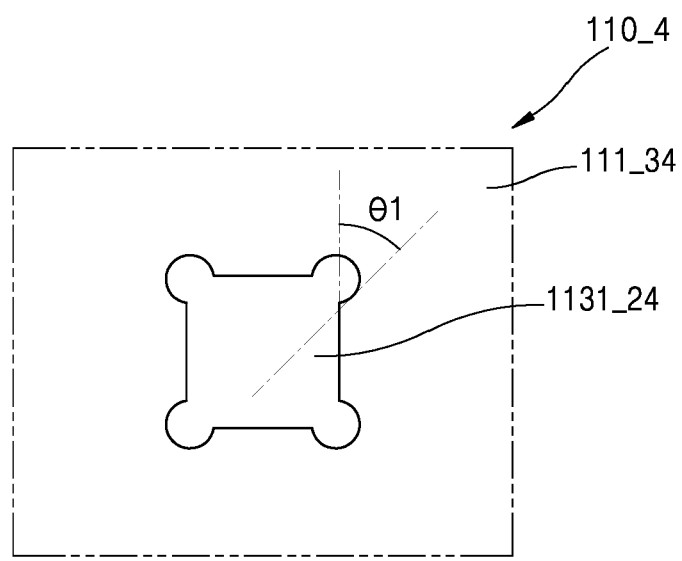
Figure 3E:
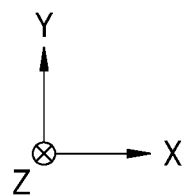
Figure 3F:
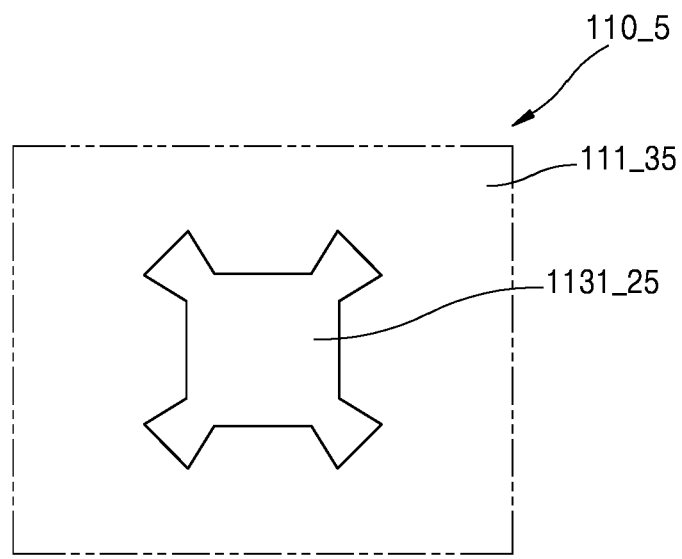

Referring to FIGS. 3E and 3F, the redistribution structures 110_4 and 110_5 may respectively include second redistribution vias 1131_24 and 1131_25 having quadrangular shapes with protruding corners and extending through third redistribution insulating layers 111_34 and 111_35 in the vertical direction. That is, in a process of forming the first via hole V1 (see FIG. 9B) described below with reference to FIG. 9B, the first via hole V1 may be formed in a quadrangular shape with protruding corners in the X-Y plane, and the second redistribution vias 1131_24 and 1131_25 filling the first via hole V1 may also have quadrangular shapes with protruding corners in the X-Y plane. The protruding corners may each have a circular shape as shown in FIG. 3E, or may each have a trapezoidal shape as shown in FIG. 3F. Also, the protruding corners may each have a polygonal shape such as a pentagonal shape, unlike in FIGS. 3E and 3F. In this case, in a quadrangular shape with protruding corners, an angle θ1 between a straight line extending from a side of the quadrangular shape and a straight line extending from any point forming a shape protruding from the corners may be an acute angle.

Figure 4:
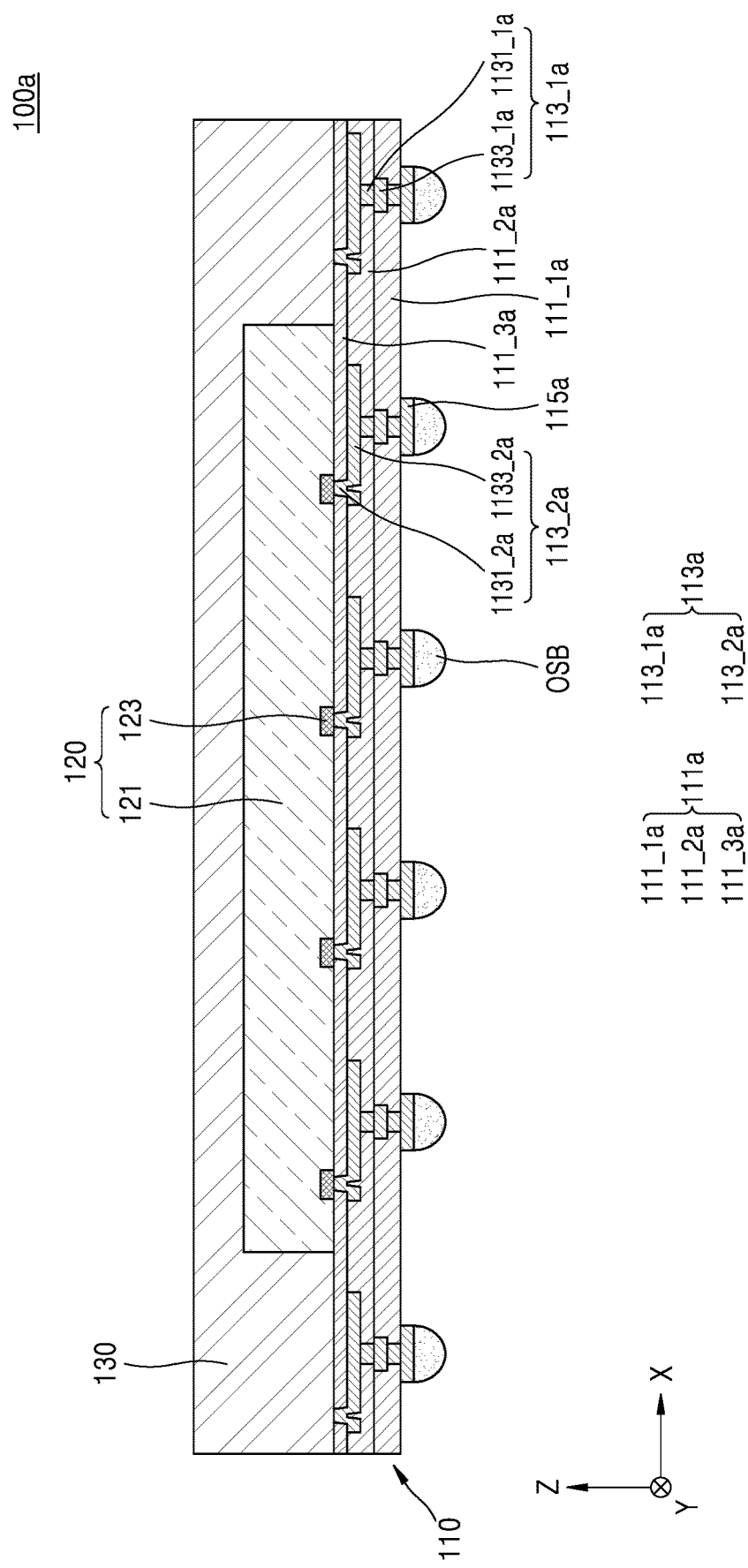
FIG. 4 is a cross-sectional view illustrating a semiconductor package, according to an embodiment.

FIG. 4 is a cross-sectional view illustrating a semiconductor package 100a, according to an embodiment. Elements of the semiconductor package 100a of FIG. 4 are similar to elements of the semiconductor package 100 described with reference to FIGS. 1 and 2A, and thus, the following will focus on a difference.

Referring to FIG. 4, the semiconductor package 100a may include a redistribution structure 110a, the semiconductor chip 120, and the molding layer 130.

The redistribution structure 110a may include a redistribution insulating layer 111a, a redistribution pattern 113a, and a UBM layer 115a.

The redistribution insulating layer 111a may include a first redistribution insulating layer 111_1a, a second redistribution insulating layer 111_2a, and a third redistribution insulating layer 111_3a. In an embodiment, each of the first redistribution insulating layer 111_1a and the second redistribution insulating layer 111_2a may include a non-photoimageable dielectric (PID) material, and the third redistribution insulating layer 111_3a may include a PID material. Although the redistribution insulating layer 111a includes three insulating layers in FIG. 1, the disclosure is not limited thereto. For example, the redistribution insulating layer 111a may include a single insulating layer, or may include four or more insulating layers. When the redistribution insulating layer 111a includes a single insulating layer, the single insulating layer may include a PID material, and when the redistribution insulating layer 111a includes four or more insulating layers, an uppermost insulating layer from among the four or more insulating layers may include a PID material and the remaining insulating materials from among the four or more insulating layers may include a non-PID material.

The redistribution pattern 113a may include a first redistribution pattern 113-1a and a second redistribution pattern 113_2a. The first redistribution pattern 113_1a may include first redistribution vias 1131_1a and first redistribution lines 1133_1a. Some of the first redistribution vias 1131_1a may be located on a bottom surface of the first redistribution insulating layer 111_1a and may extend in the vertical direction while passing through at least a part of the first redistribution insulating layer 111_1a, and the rest of the first redistribution vias 1131_1a may be located on a top surface of the first redistribution insulating layer 111a_1a and may extend in the vertical direction while passing through at least a part of the second redistribution insulating layer 111_2a. The first redistribution vias 1131_1a may have a quadrangular shape in a Z-X plane. The first redistribution line 1133_1a may be located between some of the first redistribution vias 1131_1a located on the bottom surface of the first redistribution insulating layer 111_1a and the rest of the first redistribution vias 1131_1a located on the top surface of the first redistribution insulating layer 111_1a, and may be connected to the redistribution vias 1131_1a. At least a part of the first redistribution line 1133_1a may be covered by the first redistribution insulating layer 111_1a. For example, a part of a bottom surface and both side surfaces of the first redistribution line 1133_1a may be covered by the first redistribution insulating layer 111_1a.

The second redistribution pattern 113_2a may be connected to the first redistribution pattern 113_1a. The second redistribution pattern 113_2a may include second redistribution vias 1131_2a and second redistribution lines 1133_2a.

The second redistribution pattern 113_2a may be substantially the same as or similar to the second redistribution pattern 113_2 described with reference to FIG. 1, and the first redistribution pattern 113a may include a material that is substantially the same as or similar to that of the second redistribution pattern 113_2 described with reference to FIG. 1.

The UBM layer 115a may be located on the bottom surface of the first redistribution insulating layer 111_1a. The UBM layer 115a may have a quadrangular shape in the Z-X plane. The UBM layer 115a may electrically connect the first redistribution pattern 113_1a and the second redistribution pattern 113_2a to the external connection terminal OSB. The UBM layer 115a may be substantially the same as or similar to the UBM layer 115 described with reference to FIG. 1.

Figure 5:
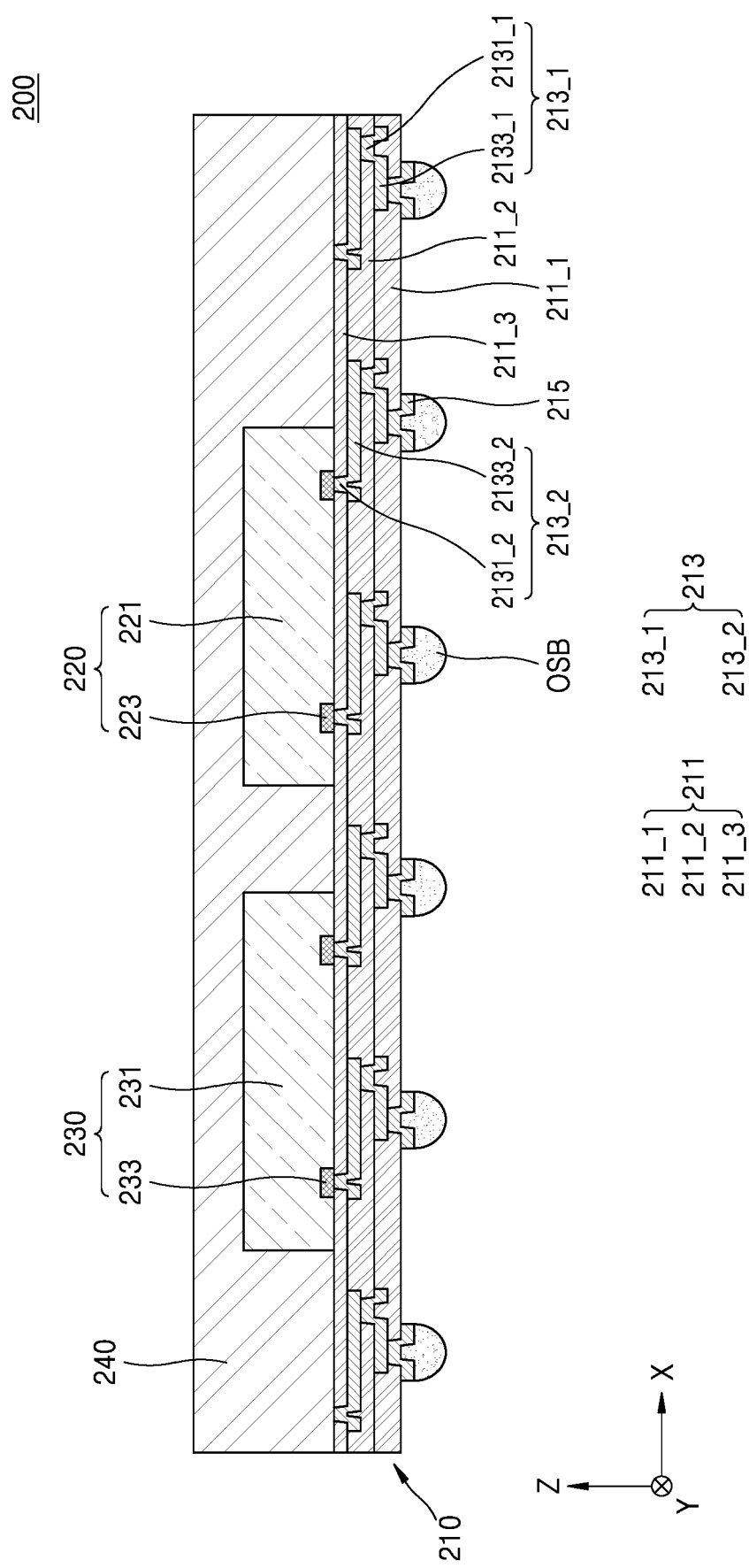
FIG. 5 is a cross-sectional view illustrating a semiconductor package, according to an embodiment.

FIG. 5 is a cross-sectional view illustrating a semiconductor package 200, according to an embodiment. Elements of the semiconductor package 200 of FIG. 5 are similar to elements of the semiconductor package 100 of FIG. 1, and thus, the following will focus on a difference.

Referring to FIG. 5, the semiconductor package 200 may include a redistribution structure 210, a first semiconductor chip 220, a second semiconductor chip 230, and a molding layer 240.

The redistribution structure 210 may include a redistribution insulating layer 211, a redistribution pattern 213, and a UBM layer 215. The redistribution insulating layer 211 may include a first redistribution insulating layer 211_1, a second redistribution insulating layer 211_2, and a third redistribution insulating layer 211_3. The redistribution insulating layer 211 may be substantially the same as or similar to the redistribution insulating layer 111 described with reference to FIGS. 1 and 2A.

The redistribution pattern 213 may include a first redistribution pattern 213_1 and a second redistribution pattern 213_2. The first redistribution pattern 213_1 may include a first redistribution via 2131_1 and a first redistribution line 2133_1. The second redistribution pattern 213_2 may include a second redistribution via 2131_2 and a second redistribution line 2133_2. The redistribution pattern 213 may be substantially the same as or similar to the redistribution pattern 113 described with reference to FIGS. 1 and 2A.

The UBM layer 215 may be located on a bottom surface of the second redistribution pattern 213_1. The UBM layer 215 may be substantially the same as or similar to the UBM layer 115 described with reference to FIG. 1.

The external connection terminal OSB may be located on a bottom surface of the redistribution structure 210.

The first semiconductor chip 220 and the second semiconductor chip 230 may be mounted on the redistribution structure 210. In this case, the first semiconductor chip 220 and the second semiconductor chip 230 may be spaced apart from each other. The first semiconductor chip 220 may include a first semiconductor substrate 221 and a first chip pad 223, and the second semiconductor chip 230 may include a second semiconductor substrate 231 and a second chip pad 233. Elements of the first semiconductor chip 220 and the second semiconductor chip 230 may be similar to elements of the semiconductor chip 120 described with reference to FIG. 1.

In an embodiment, the first semiconductor chip 220 and the second semiconductor chip 230 may be the same type of semiconductor chip, or may be different types of semiconductor chips.

In an embodiment, the first semiconductor chip 220 and the second semiconductor chip 230 may be logic chips. In an embodiment, the first semiconductor chip 220 and the second semiconductor chip 230 may be electrically connected to each other, to operate as one logic chip.

In an embodiment, the first semiconductor chip 220 may be a memory chip, and the second semiconductor chip 230 may be a logic chip. For example, the first semiconductor chip 220 may be a DRAM chip, and the second semiconductor chip 230 may be a central processing unit (CPU) chip.

The molding layer 240 may be located on the redistribution structure 210, and may cover the first semiconductor chip 220 and the second semiconductor chip 230. The molding layer 240 may be similar to the molding layer 130 described with reference to FIG. 1.

Figure 6:
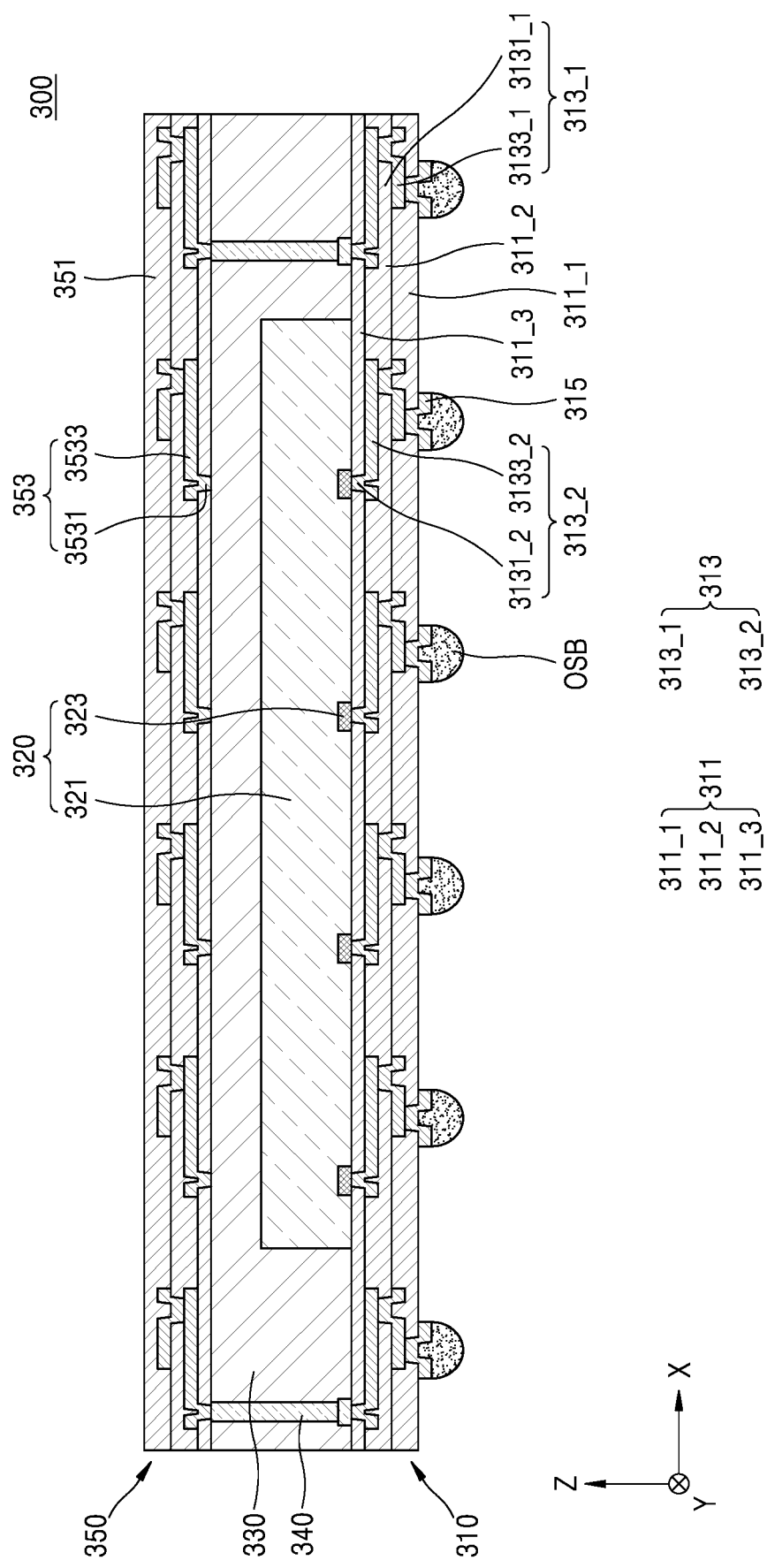
FIG. 6 is a cross-sectional view illustrating a semiconductor package, according to an embodiment.

FIG. 6 is a cross-sectional view illustrating a semiconductor package 300, according to an embodiment. Elements of the semiconductor package 300 of FIG. 6 are similar to elements of the semiconductor package 100 described with reference to FIG. 1, and thus, the following will focus on a difference.

Referring to FIG. 6, the semiconductor package 300 may include a first redistribution structure 310, a semiconductor chip 320, a molding layer 330, a connection structure 340, and a second redistribution structure 350.

The first redistribution structure 310 may include a first redistribution insulating layer 311, a first redistribution pattern 313, and a first UBM layer 315. The first redistribution insulating layer 311 may include a first sub-redistribution insulating layer 311_1, a second sub-redistribution insulating layer 311_2, and a third sub-redistribution insulating layer 311_3. The first redistribution insulating layer 311 may be substantially the same as or similar to the redistribution insulating layer 111 described with reference to FIGS. 1 and 2A.

The first redistribution pattern 313 may include a first sub-redistribution pattern 313_1 and a second sub-redistribution pattern 313_2. The first redistribution pattern 313_1 may include a first sub-redistribution via 3131_1 and a first sub-redistribution line 3133_1. The second redistribution pattern 313_2 may include a second sub-redistribution via 3131_2 and a second sub-redistribution line 3133_2. The first redistribution pattern 313 may be substantially the same as or similar to the redistribution pattern 113 described with reference to FIGS. 1 and 2A.

The UBM layer 315 may be located on a bottom surface of the second redistribution pattern 313_1. The UBM layer 315 may be substantially the same as or similar to the UBM layer 115 described with reference to FIG. 1.

The semiconductor chip 320 may be located on the first redistribution structure 310. The semiconductor chip 320 may be substantially the same as or similar to the semiconductor chip 120 described with reference to FIG. 1.

The molding layer 330 may be located on the first redistribution structure 310, and may cover the semiconductor chip 320. The molding layer 330 may be substantially the same as or similar to the molding layer 130 described with reference to FIG. 1.

The connection structure 340 may be located on the first redistribution structure 310. The connection structure 340 may extend in the vertical direction while passing through the molding layer 330. The connection structure 340 may be physically and electrically connected to the first redistribution structure 310. In an embodiment, the connection structure 340 may include one of a through-mold via (TMV), a conductive solder, a conductive pillar, and a conductive bump. In an embodiment, the connection structure 340 may include, but is not limited to, copper (Cu).

The second redistribution structure 350 may be located on the molding layer 330. The second redistribution structure 350 may include a second redistribution insulating layer 351 and a second redistribution pattern 353. The second redistribution pattern 353 may include a second sub-redistribution via 3531 and a second sub-redistribution line 3533. The second redistribution structure 350 may be substantially the same as or similar to the first redistribution structure 310, but the disclosure is not limited thereto. The second redistribution structure 350 may be electrically connected to the first redistribution structure 310 by the connection structure 340.

Figure 7:
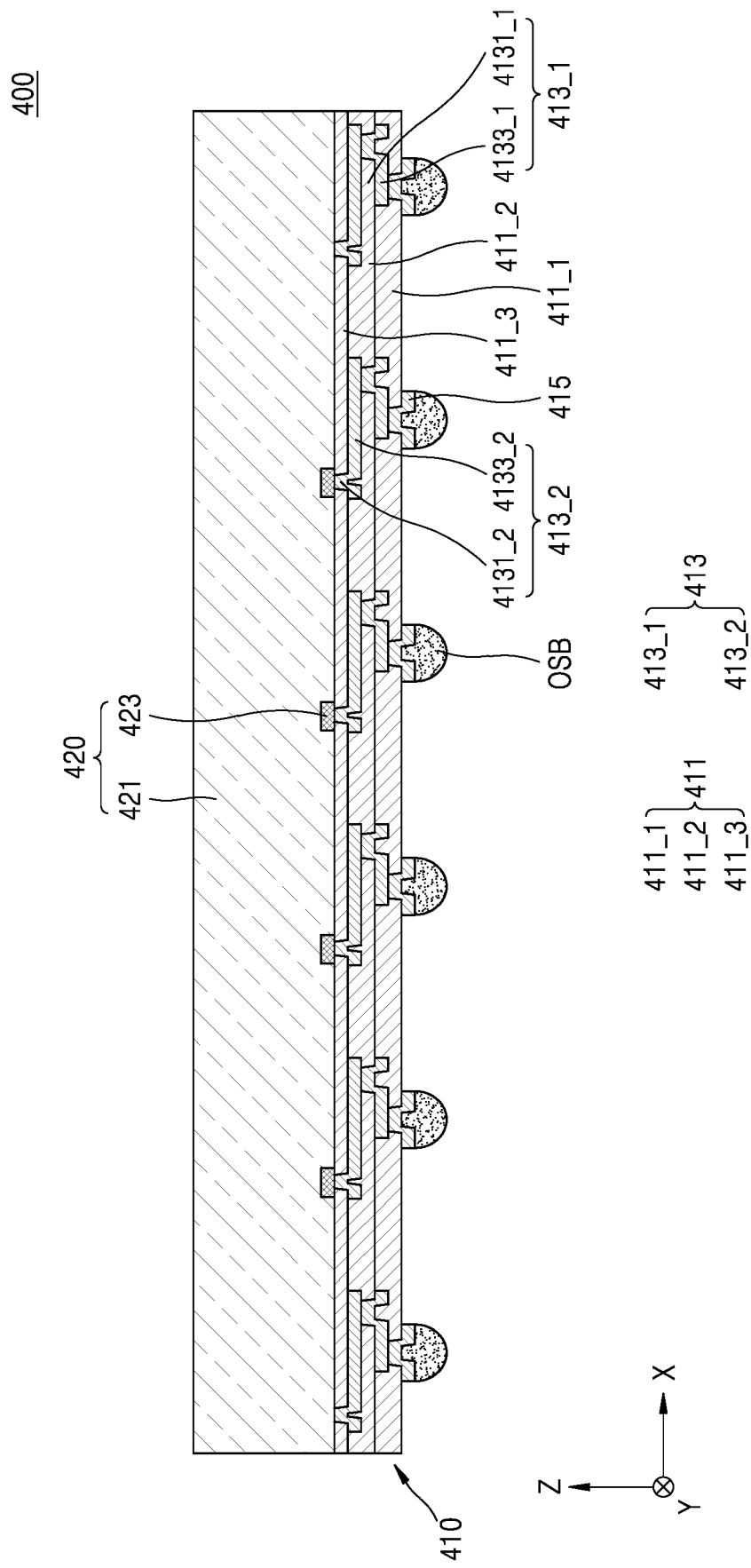
FIG. 7 is a cross-sectional view illustrating a semiconductor package, according to an embodiment.

FIG. 7 is a cross-sectional view illustrating a semiconductor package 400, according to an embodiment. Elements of the semiconductor package 400 of FIG. 7 are similar to elements of the semiconductor package 100 described with reference to FIG. 1, and thus, the following will focus on a difference.

Referring to FIG. 7, the semiconductor package 400 may include a redistribution structure 410 and a semiconductor chip 420.

The redistribution structure 410 may include a redistribution insulating layer 411, a redistribution pattern 413, and a UBM layer 415. The redistribution insulating layer 411 may include a first redistribution insulating layer 411_1, a second redistribution insulating layer 411_2, and a third redistribution insulating layer 411_3. The redistribution insulating layer 411 may be substantially the same as or similar to the redistribution insulating layer 111 described with reference to FIGS. 1 and 2A.

The redistribution pattern 413 may include a first redistribution pattern 413_1 and a second redistribution pattern 413_2. The first redistribution pattern 413-1 may include a first redistribution via 4131_1 and a first redistribution line 4133_1. The second redistribution pattern 413_2 may include a second redistribution via 4131_2 and a second redistribution line 4133_2. The redistribution pattern 413 may be substantially the same as or similar to the redistribution pattern 113 described with reference to FIGS. 1 and 2A.

The UBM layer 415 may be located on a bottom surface of the second redistribution pattern 413_1. The UBM layer 415 may be substantially the same as or similar to the UBM layer 115 described with reference to FIG. 1.

The semiconductor chip 420 may be located on the redistribution structure 410. In an embodiment, a horizontal width of the semiconductor chip 420 may be substantially the same as a horizontal width of the redistribution structure 410. That is, the semiconductor package 400 may be a fan-in package.

Figure 8:
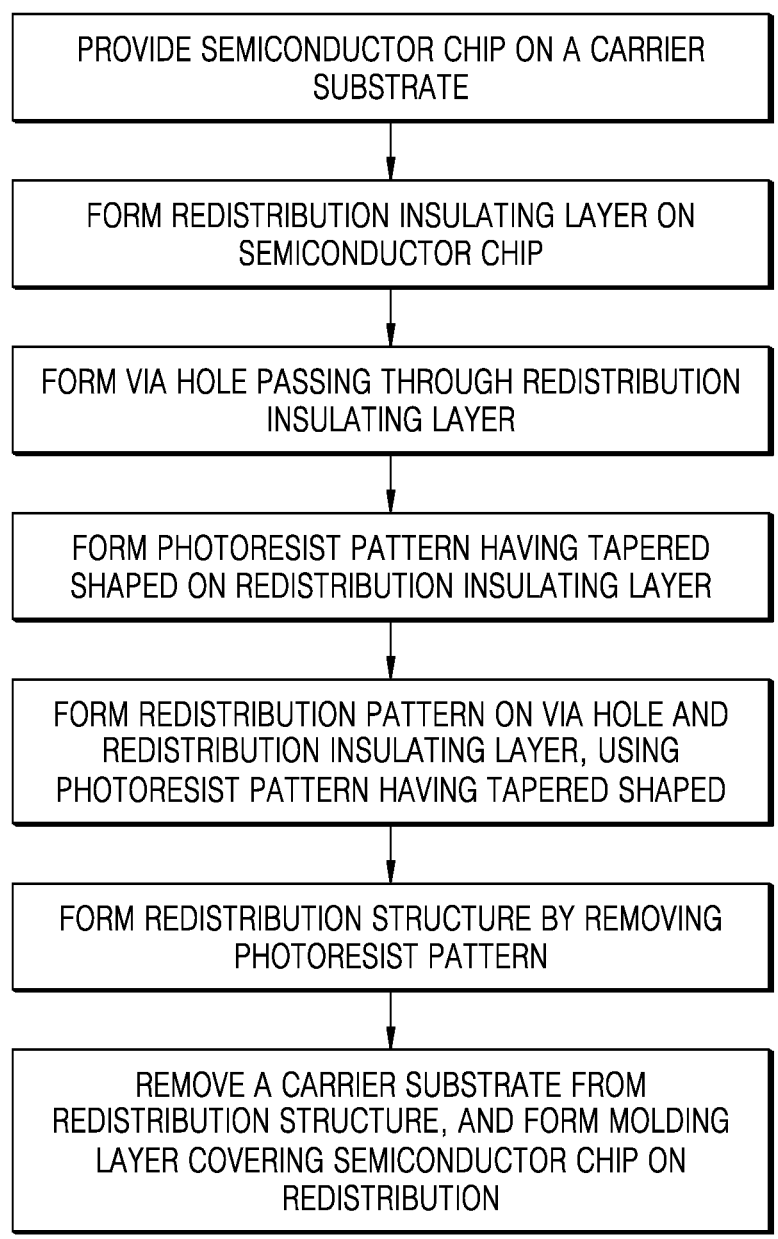
FIG. 8 is a flowchart illustrating a method of manufacturing a semiconductor package, according to an embodiment.

FIG. 8 is a flowchart illustrating a method of manufacturing the semiconductor package 100, according to an embodiment. FIGS. 9A through 9K are enlarged cross-sectional views illustrating steps of a method of manufacturing the semiconductor package 100, according to an embodiment. In detail, FIGS. 9A through 9K are enlarged cross-sectional views illustrating a portion POR2 of FIG. 1.

Figure 9A:
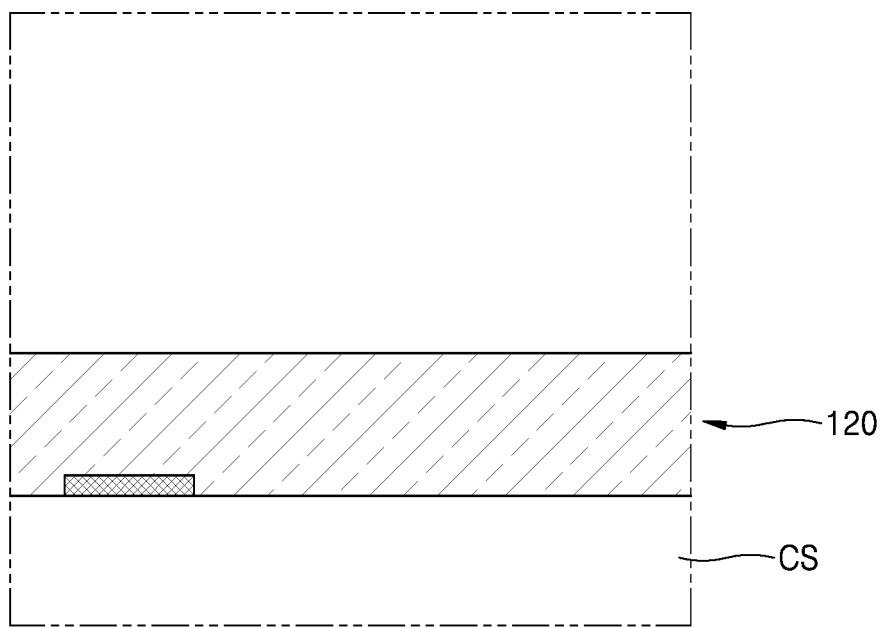
FIGS. 9A through 9K are enlarged cross-sectional views illustrating steps of a method manufacturing a semiconductor package, according to an embodiment.

Referring to FIGS. 8 and 9A, first, the semiconductor chip 120 may be provided on a carrier substrate CS. The carrier substrate CS may be, for example, but is not limited to, a semiconductor substrate, a glass substrate, a ceramic substrate, or a plastic substrate.

Figure 9B:
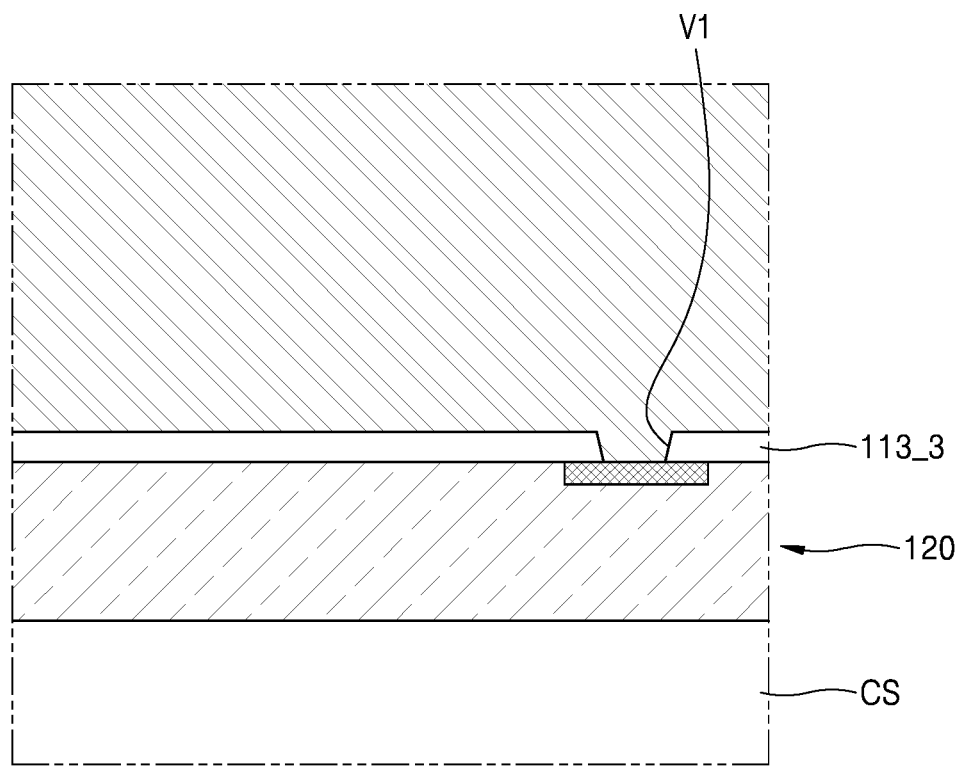

Referring to FIGS. 8 and 9B, in a resultant structure of FIG. 9A, the third redistribution insulating layer 111_3 may be formed on the semiconductor chip 120. Next, the first via hole V1 passing through the third redistribution insulating layer 111_3 may be formed by patterning the third redistribution insulating layer 111_3. The first via hole V1 may be aligned with the chip pad 123 (see FIG. 1) of the semiconductor chip 120 in the vertical direction. Inner side walls of the first via hole V1 may have a certain inclination.

Figure 9C:
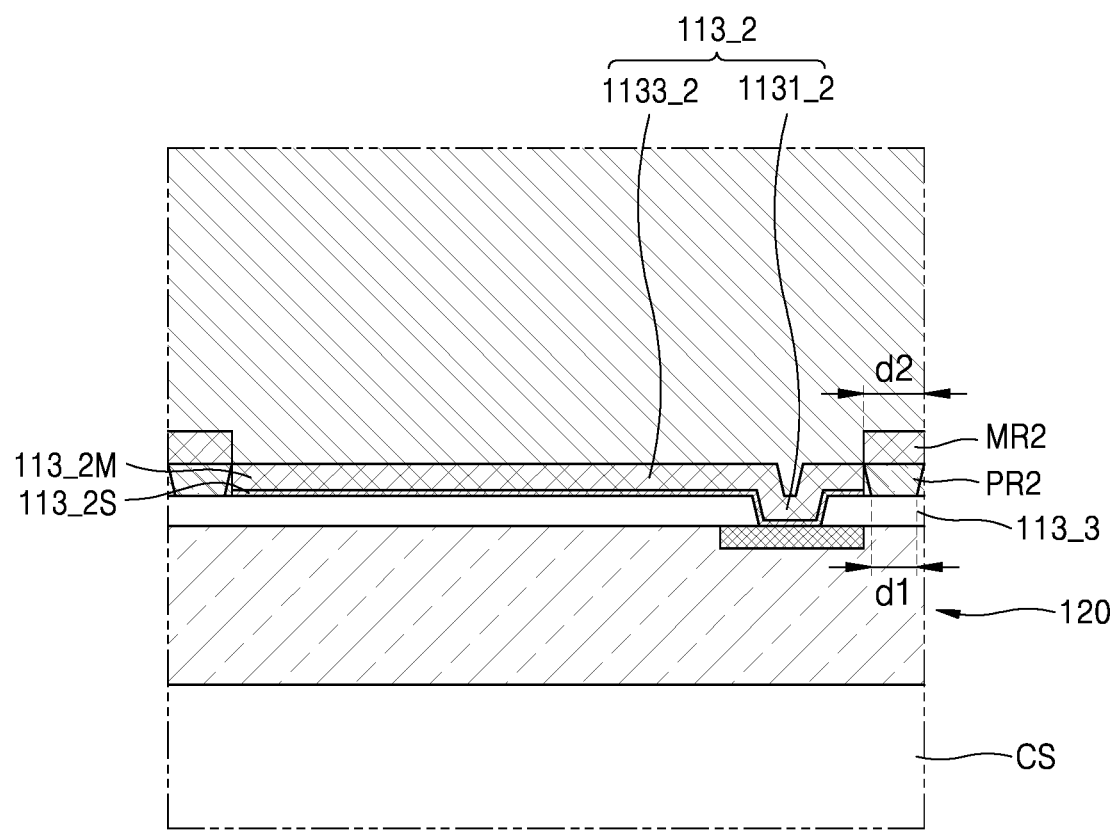

Referring to FIGS. 8 and 9C, in a resultant structure of FIG. 9B, a photoresist material layer may be applied to the third redistribution insulating layer 111_3, and a first photoresist pattern PR1 may be formed by patterning the photoresist material layer. The photoresist material layer may be, for example, a negative photoresist material layer. In an embodiment, the first photoresist pattern PR1 may have a tapered shape whose horizontal width increases away from the semiconductor chip 120. That is, a width d2 of a top surface of the first photoresist pattern PR1 may be greater than a width d1 of a bottom surface of the first photoresist pattern PR1. For example, a ratio between the horizontal width d2 of the top surface of the first photoresist pattern PR1 and the horizontal width d1 of the bottom surface of the first photoresist pattern PR1 may range from about 1:0.9 to about 1:0.3, from about 1:0.8 to about 1:0.4, or from about 1:0.7 to about 1:0.45.

Because the first photoresist pattern PR1 has a tapered shape, a metal material layer of the second redistribution pattern 113_2 may not be deposited on a part of the third redistribution insulating layer 111_3 that overlaps the top surface of the first photoresist pattern PR1 in the vertical direction but does not overlap the bottom surface of the first photoresist pattern PR1 in the vertical direction.

Next, the second redistribution pattern 113_2 filling an inner wall of the first via hole V1 and the third redistribution insulating layer 111_3 may be formed. In this case, the second redistribution via 1131_2 and the second redistribution line 1133_2 may be integrally formed with each other at the same time. Because the horizontal width of the top surface of the first photoresist pattern PR1 is greater than the horizontal width of the bottom surface of the first photoresist pattern PR1, both ends of the second redistribution pattern 13_2 may match corresponding ends of the first photoresist pattern PR1 in the vertical direction. That is, the first photoresist pattern PR1 and the second redistribution pattern 113_2 may not overlap each other in the vertical direction. However, the disclosure is not limited thereto, and both ends of the second redistribution pattern 113_2 may be respectively spaced apart from corresponding ends of the first photoresist pattern PR1. In this case, a distance between both ends of the second redistribution pattern 113_2 and corresponding ends of the first photoresist pattern PR1 may range from about 0.001 μm to about 2 μm.

In an embodiment, the second redistribution pattern 113_2 may be formed by using one process selected from among sputtering, electron-beam evaporation, and electroless plating.

In an embodiment, a step of forming the second redistribution pattern 113_2 may include a step of forming the second seed layer 113_2S on an inner wall of the third redistribution insulating layer 111_3 and the third redistribution insulating layer 111_3 and a step of forming the second metal layer 113_2M on the second seed layer 113_2S. In an embodiment, the step of forming the second seed layer 113_2S and the step of forming the second metal layer 113_2M may be one process selected from among sputtering, electron-beam evaporation, and electroless plating. For example, the second seed layer 113_2S may be formed through sputtering, and the second metal layer 113_2M may be formed through electron-beam evaporation. When the second metal layer 113_2M includes a single layer, the second metal layer 113_2M may be formed by using a single process. For example, when the second metal layer 113_2M includes a single layer, the second metal layer 113_2M may be formed by performing only sputtering.

In an embodiment, the second metal layer 113_2M may include a plurality of layers (not shown). In this case, the plurality of layers may be formed by alternately performing sputtering and electron-beam evaporation. For example, when the second metal layer 113_2M includes three layers, the three layers may be formed by sequentially performing sputtering, electron-beam evaporation, and sputtering, or may be formed by sequentially performing electron-beam evaporation, sputtering, and electron-beam evaporation.

As the second redistribution pattern 113_2 is formed, a first metal material layer MR1 may be formed on the first photoresist pattern PR1. The first metal material layer MR1 may be substantially the same as or similar to the second redistribution pattern 113_2. For example, when the second redistribution pattern 113_2 includes the second seed layer 113_2S and the second metal layer 113_2M, the first metal material layer MR1 may include a seed layer and a metal layer corresponding thereto.

Figure 9D:
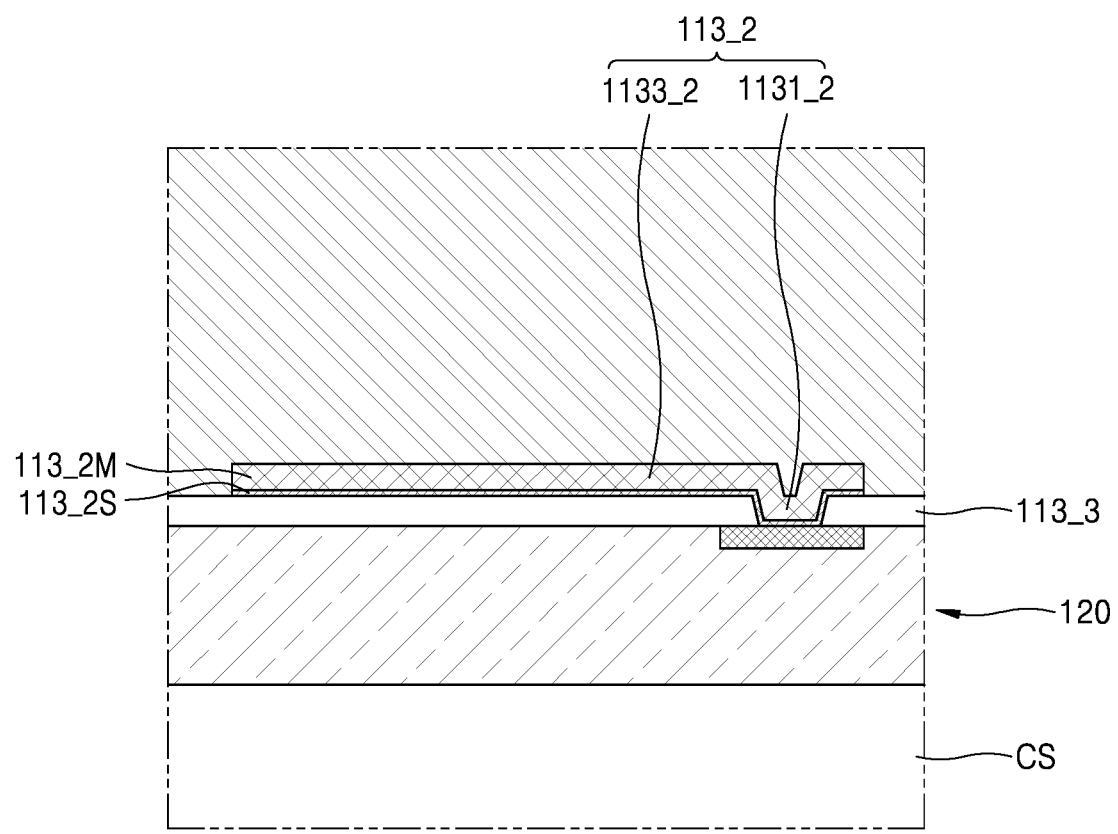

Referring to FIGS. 8 and 9D, in a resultant structure of FIG. 9C, the first photoresist pattern PR1 may be removed. The first photoresist pattern PR1 may be removed by using a lift-off method. Accordingly, the first metal material layer MR1 on the first photoresist pattern PR1 may also be removed along with the first photoresist pattern PR1 during the lift-off method.

Figure 9E:
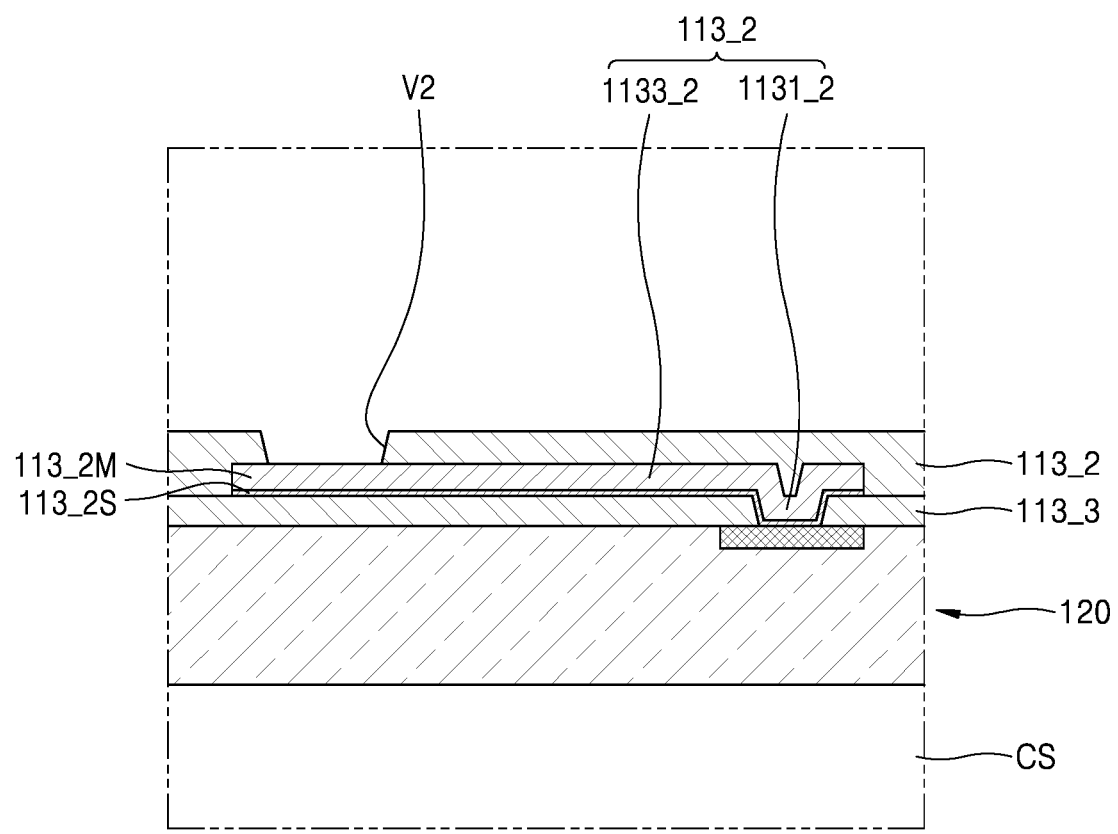

Referring to FIG. 9E, in a resultant structure of FIG. 9D, the second redistribution insulating layer 111_2 may be formed on the second redistribution line 1133_2 of the second redistribution pattern 113_2 and the third redistribution insulating layer 111_3 Next, the second via hole V2 passing through the second redistribution insulating layer 111_2 may be formed by patterning the second redistribution insulating layer 111_2. Inner side walls of the second via hole V2 may have a certain inclination.

Figure 9F:
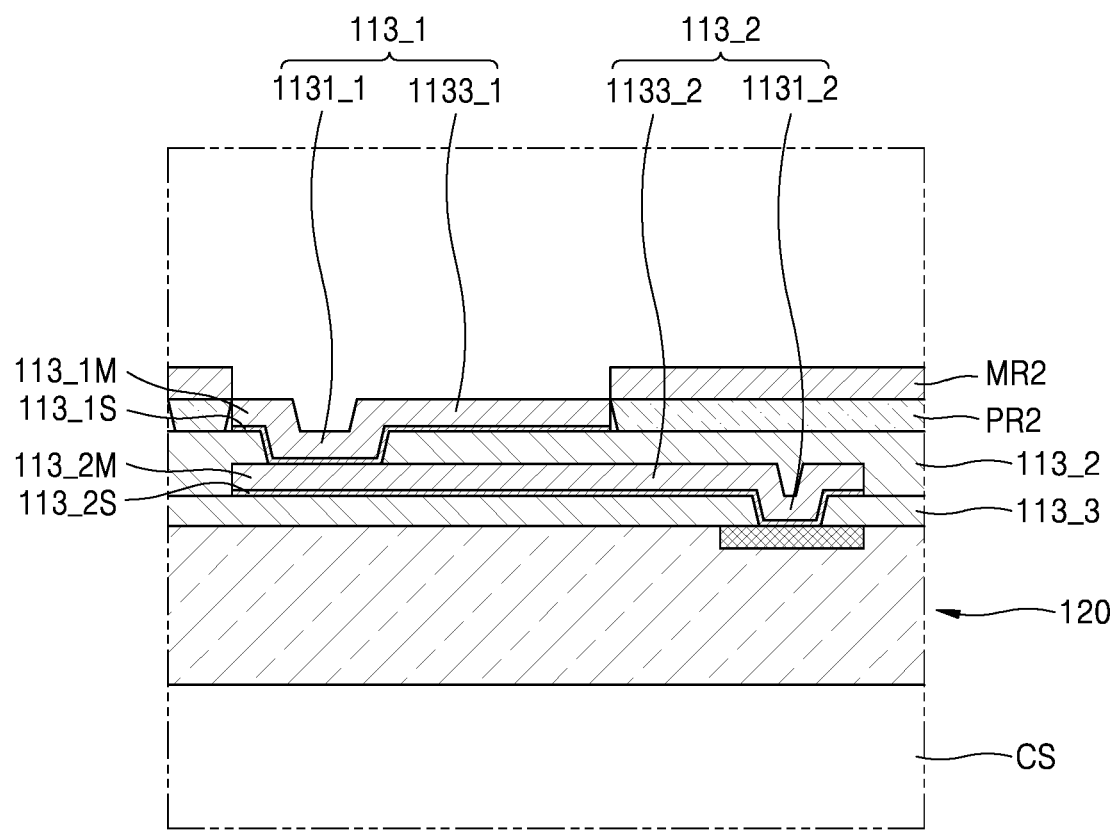

Referring to FIG. 9F, in a resultant structure of FIG. 9E, a photoresist material layer may be applied to the second redistribution insulating layer 111_2, and a second photoresist pattern PR2 may be formed by patterning the photoresist material layer. The second photoresist pattern PR2 may be substantially the same as or similar to the first photoresist pattern PR1 described with reference to FIG. 9C.

Next, the first redistribution pattern 113_1 filling an inner wall of the second via hole V2 and the second redistribution insulating layer 111_2 may be formed. Because the second photoresist pattern PR2 has a tapered shape in which a horizontal width of a top surface is greater than a horizontal width of a bottom surface, both ends of the first redistribution pattern 113_1 may match corresponding ends of the second photoresist pattern PR2 in the vertical direction. That is, the first redistribution pattern 113_1 and the second photoresist pattern PR2 may not overlap each other in the vertical direction. The first redistribution pattern 113_1 may be formed in a similar method to that used to form the second redistribution pattern 113_2 described with reference to FIG. 9C, and may be substantially the same as or similar to the second redistribution pattern 113_2.

As the first redistribution pattern 113_1 is formed, a second metal material layer MR2 may be formed on the second photoresist pattern PR2. The second metal material layer MR2 may be substantially the same as or similar to the first redistribution pattern 113_1.

Figure 9G:
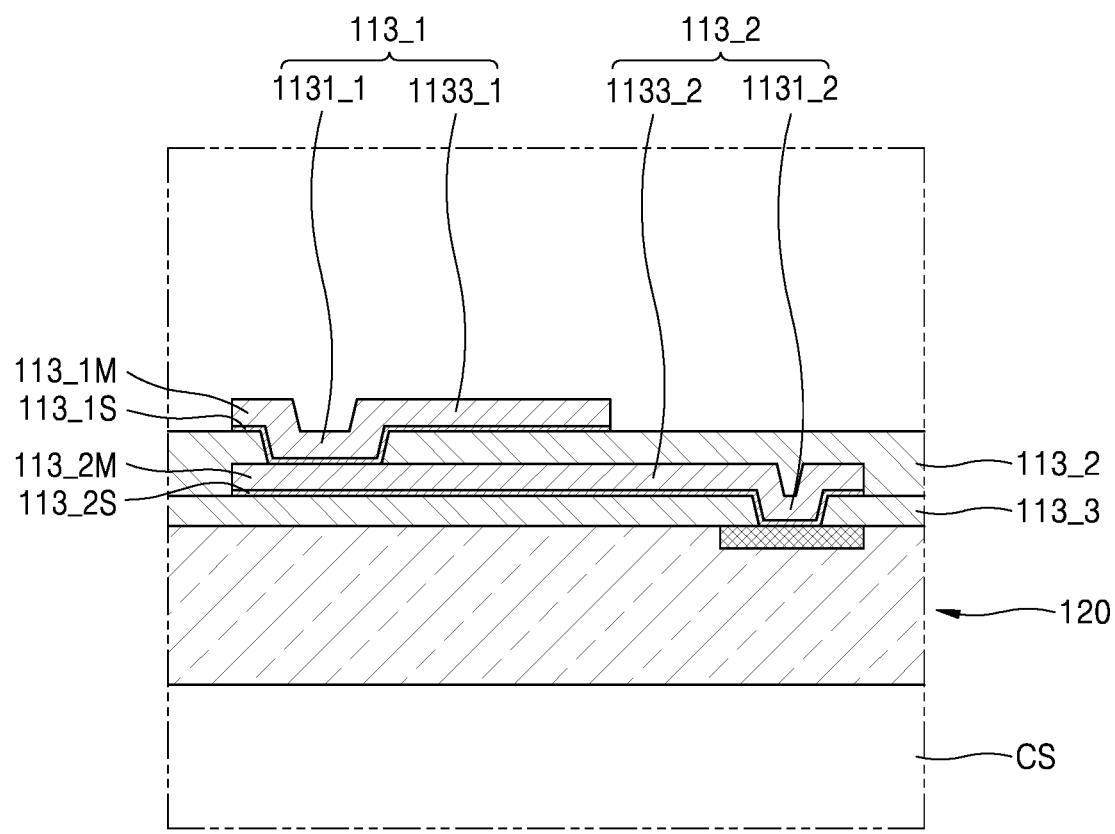

Referring to FIG. 9G, in a resultant structure of FIG. 9F, the second photoresist pattern PR2 may be removed. The second photoresist pattern PR2 may be removed by using a lift-off method. Accordingly, the second metal material layer MR2 on the second photoresist pattern PR2 may also be removed along with the second photoresist pattern PR2 during the lift-off method.

Figure 9H:
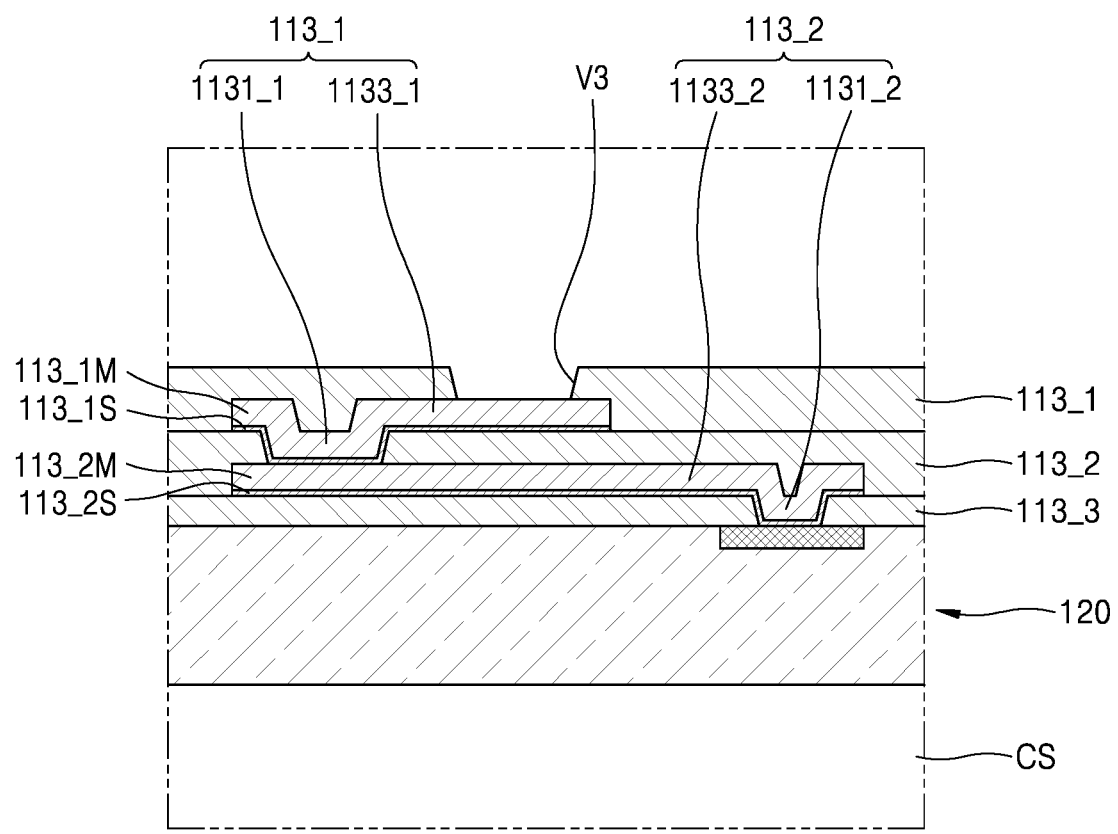

Referring to FIG. 9H, in a resultant structure of FIG. 9G, the first redistribution insulating layer 111_1 may be formed on the first redistribution line 1133_1 of the first redistribution pattern 113_1 and the second redistribution insulating layer 111_2. Next, a third via hole V3 passing through the first redistribution insulating layer 111_1 may be formed by patterning the first redistribution insulating layer 111_1. Inner side walls of the third via hole V3 may have a certain inclination.

Figure 9I:
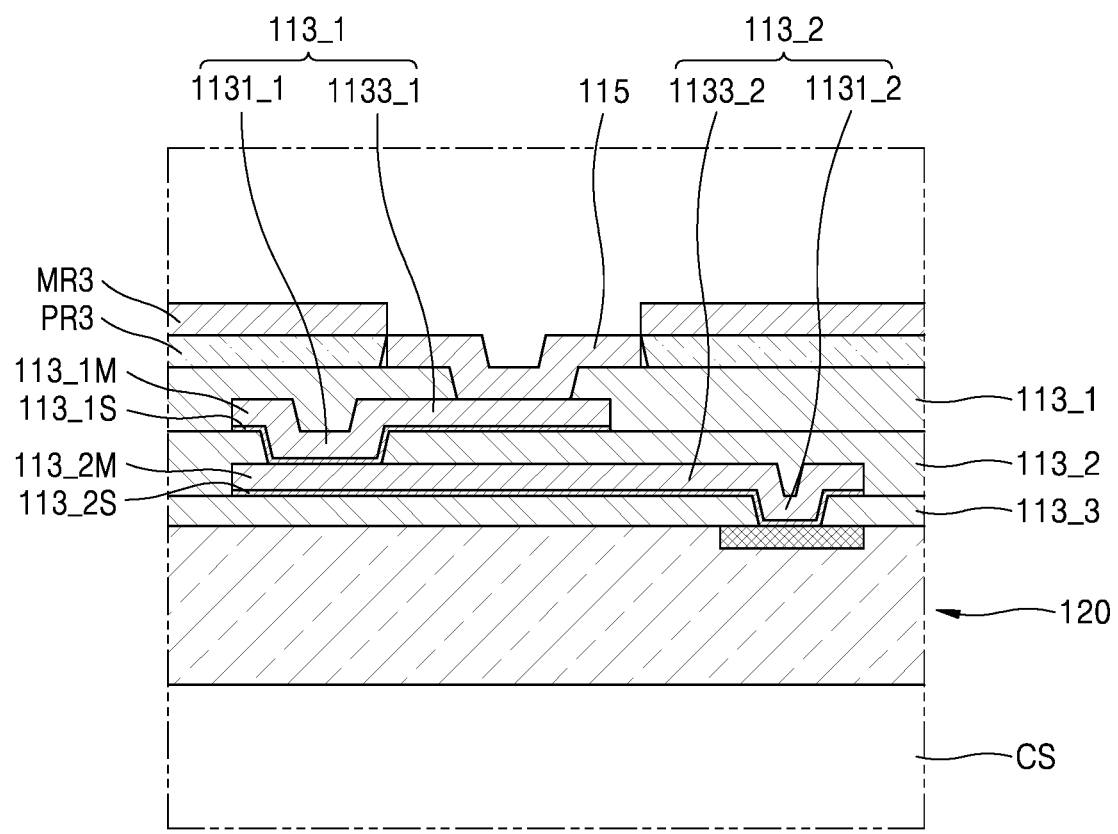

Referring to FIG. 9I, in a resultant structure of FIG. 9H, a photoresist material layer may be applied to the first redistribution insulating layer 111_1, and a third photoresist pattern PR3 may be formed by patterning the photoresist material layer. The third photoresist pattern PR3 may be substantially the same as or similar to the first photoresist pattern PR1 described with reference to FIG. 9C.

Next, the UBM layer 115 filling an inner wall of the third via hole V3 and the first redistribution insulating layer 111_1 may be formed. The UBM layer 115 may be formed by using any one of, for example, sputtering, electron-beam evaporation, and electroless plating. As the UBM layer 115 is formed, a third metal material layer MR3 may be formed on the third photoresist pattern PR3.

Figure 9J:
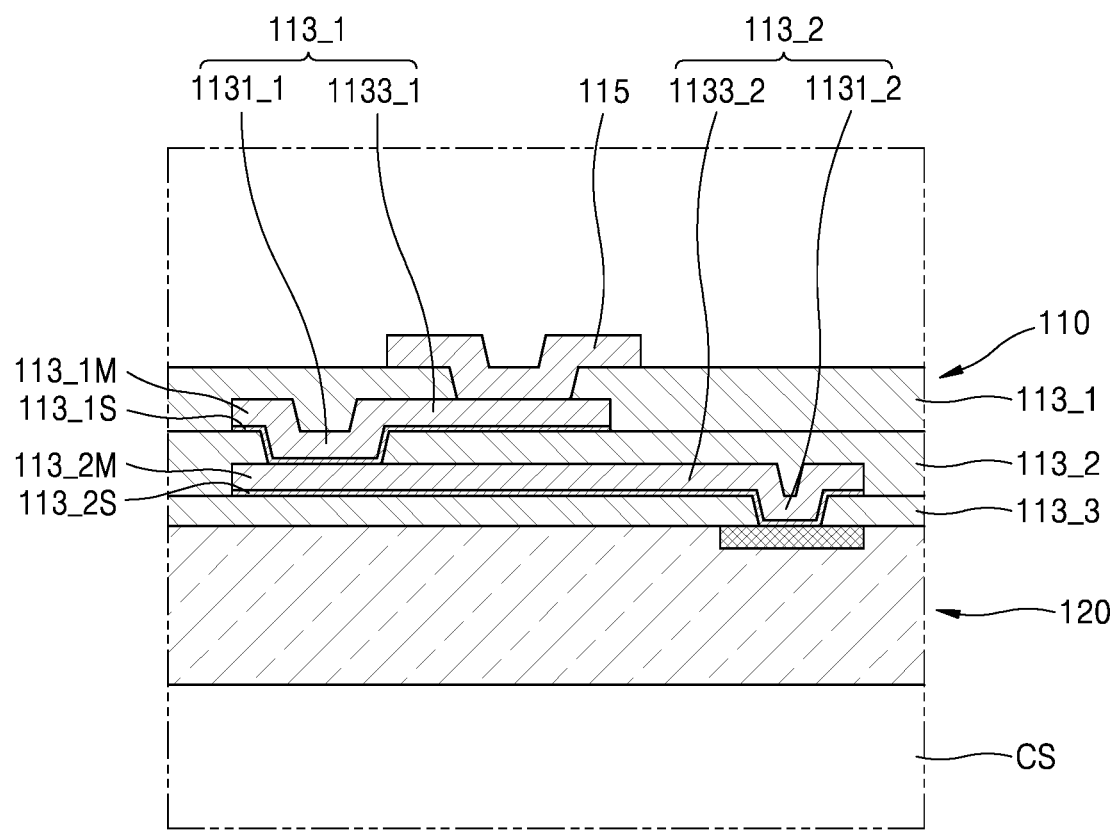

Referring to FIG. 9J, in a resultant structure of FIG. 9I, the third photoresist pattern PR3 may be removed. The third photoresist pattern PR3 may be removed by using a lift-off method. Accordingly, the third metal material layer MR3 on the third photoresist pattern PR3 may also be removed along with the third photoresist pattern PR3 during the lift-off method.

Figure 9K:
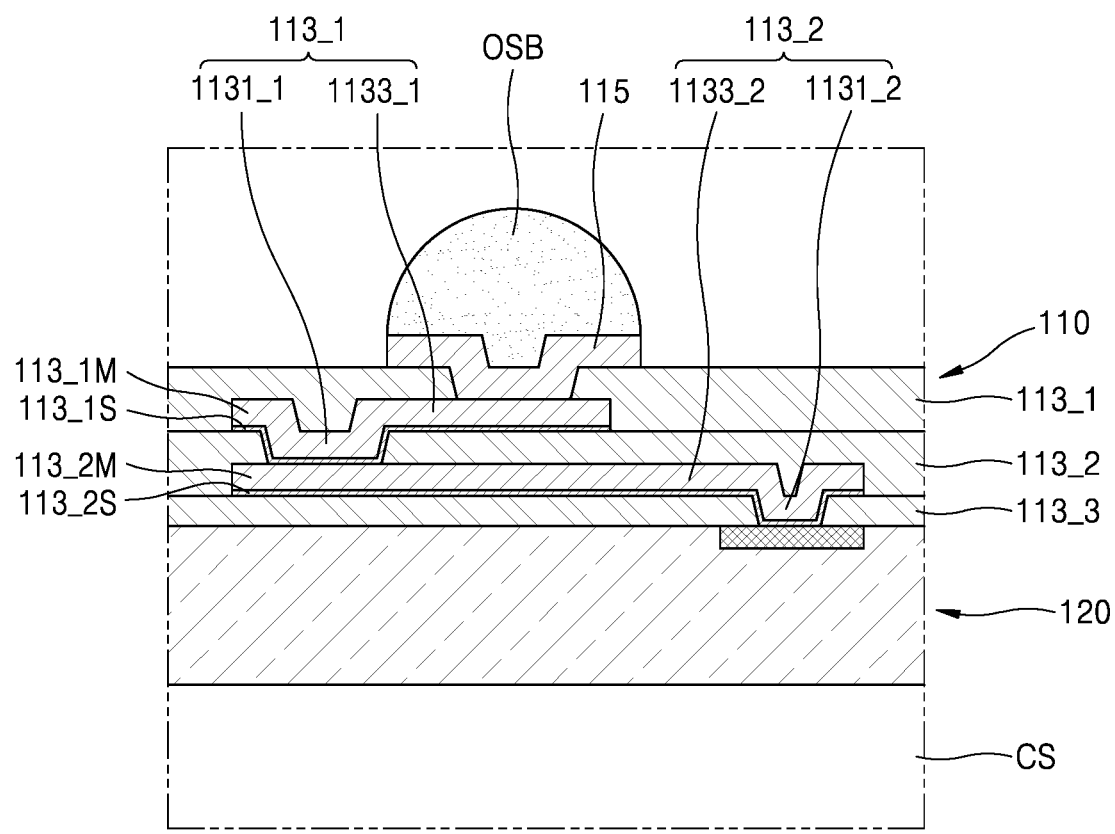

Referring to FIG. 9K, in a resultant structure of FIG. 9J, the external connection terminal SOB may be formed on the UBM layer 115.

Next, in a resultant structure of FIG. 9K, the carrier substrate CS may be removed, and the redistribution structure 110 from which the carrier substrate CS is removed may be turned over. Next, the molding layer 130 covering the semiconductor chip 120 may be formed on the redistribution structure 110. As the molding layer 130 is formed, the semiconductor package 100 according to an embodiment illustrated in FIG. 1 may be manufactured.

A conventional semiconductor package includes a redistribution pattern manufactured by forming a seed layer, forming a photoresist pattern on the seed layer, forming a redistribution pattern by performing electroplating by using the seed layer and the photoresist pattern, removing the photoresist pattern, and etching the seed layer exposed by the redistribution pattern. In the redistribution structure according to the conventional manufacturing method, because the redistribution pattern is formed by using electroplating, an under-cut may occur in a lower edge of the redistribution pattern as described with reference to FIG. 2B. Also, as described with reference to FIG. 2B, because a thickness of an edge of the redistribution pattern and a thickness of a central portion of the redistribution pattern are different from each other, a top surface or a bottom surface of the redistribution pattern may have an arc shape. Accordingly, electrical characteristics of the redistribution pattern may be degraded, and thus, functional characteristics of a semiconductor package including the redistribution pattern may be degraded.

In contrast, in the semiconductor package 100 according to an embodiment, because a redistribution pattern is formed by using sputtering or electron-beam evaporation, an undercut may not occur at an edge of the redistribution pattern, and a thickness of an edge of the redistribution pattern and a thickness of a central portion of the redistribution pattern are substantially the same or similar. Accordingly, electrical characteristics of the redistribution pattern may be improved, and functional characteristics of the semiconductor package 100 including the redistribution pattern may be improved. Also, because a manufacturing method is simpler than the conventional method of manufacturing the redistribution structure, the productivity of a process of manufacturing the semiconductor package 100 may also be improved.

According to embodiments, a semiconductor package includes a redistribution structure including a redistribution pattern in which an under-cut is not generated in a lower edge and a thickness of an edge and a thickness of a central portion are substantially the same. Accordingly, electrical characteristics of the redistribution structure may be improved, and functional characteristics of the semiconductor package may be improved.

Also, according to embodiments, because a photoresist pattern having a tapered shape is used and the redistribution pattern is formed by removing the photoresist pattern by using a lift-off method, a process of manufacturing the semiconductor package including the redistribution pattern may be simplified. Accordingly, the productivity of a method of manufacturing the semiconductor package may be improved.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A semiconductor package comprising:
a first redistribution structure comprising: at least one first redistribution insulating layer comprising a photo-imageable dielectric (PID) material; and at least one first redistribution pattern comprising a first redistribution via and a first redistribution line; and
at least one semiconductor chip located on the first redistribution structure,
wherein the first redistribution via comprises a first via layer located over a via hole passing through the first redistribution insulating layer in a vertical direction and having a first thickness, a second via layer located on an inner side wall of the via hole and having a second thickness, and a third via layer located under the via hole and having a third thickness,
wherein the second via layer has a certain inclination angle with respect to a horizontal direction,
wherein the first thickness and the second thickness are substantially same, and the third thickness is about 0.25 times to about 0.75 times the first thickness.

2. The semiconductor package of claim 1, wherein the first redistribution pattern comprises at least one selected from among copper (Cu), gold (Au), nickel (Ni), tin (Sn), platinum (Pt), lead (Pb), silver (Ag), tungsten (W), and an alloy thereof.

3. The semiconductor package of claim 1, wherein the first redistribution via has one shape selected from among a polygonal shape, a circular shape, an elliptical shape, a polygonal shape with round corners, and a polygonal shape with protruding corners, in a plane perpendicular to the vertical direction.

4. The semiconductor package of claim 1, wherein the angle of the second via layer with respect to the horizontal direction ranges from 30° to 80°.

5. The semiconductor package of claim 1, wherein a top surface and a bottom surface of the first redistribution pattern extend in the horizontal direction, and a side surface of the first redistribution pattern extends in the vertical direction.

6. The semiconductor package of claim 1, further comprising a molding layer located on the first redistribution structure, and covering at least a part of the semiconductor chip,
wherein a horizontal width of the first redistribution structure is greater than a horizontal width of the semiconductor chip.

7. The semiconductor package of claim 1, further comprising:
a connection structure located on the first redistribution structure to be spaced apart from the semiconductor chip; and
a second redistribution structure located on the semiconductor chip.

8. The semiconductor package of claim 7, wherein the connection structure comprises one of a through-mold via (TMV), a conductive solder, a conductive pillar, and a conductive bump.

9. The semiconductor package of claim 1, wherein the semiconductor chip comprises a plurality of semiconductor chips that are spaced apart from each other, and some of the plurality of semiconductor chips are memory chips and rest of the plurality of semiconductor chips are logic chips.

* * * * *